(12) United States Patent
Omote et al.

(10) Patent No.: US 11,506,532 B2
(45) Date of Patent: Nov. 22, 2022

(54) VIBRATION DETECTING DEVICE

(71) Applicants: Kabushiki Kaisha Toshiba, Tokyo (JP); Toshiba Electronic Devices & Storage Corporation, Tokyo (JP)

(72) Inventors: Hirofumi Omote, Tokyo (JP); Hiroshi Ota, Misato Saitama (JP); Ryoji Ninomiya, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 360 days.

(21) Appl. No.: 16/784,399

(22) Filed: Feb. 7, 2020

(65) Prior Publication Data

US 2020/0408594 A1 Dec. 31, 2020

(30) Foreign Application Priority Data

Jun. 28, 2019 (JP) .............................. JP2019-122088

(51) Int. Cl.
*G01H 17/00* (2006.01)
*H05K 7/14* (2006.01)
(Continued)

(52) U.S. Cl.
CPC ........... *G01H 17/00* (2013.01); *H05K 1/0277* (2013.01); *H05K 1/144* (2013.01); *H05K 1/181* (2013.01); *H05K 5/0026* (2013.01); *H05K 7/1427* (2013.01); *H05K 2201/042* (2013.01); *H05K 2201/10113* (2013.01); *H05K 2201/10151* (2013.01); *H05K 2201/10189* (2013.01)

(58) Field of Classification Search
CPC ...... G01H 17/00; H05K 1/0277; H05K 1/144; H05K 1/181; H05K 5/0026; H05K 7/1427; H05K 2201/042; H05K 2201/10113; H05K 2201/10151; H05K 2201/10189
See application file for complete search history.

(56) References Cited

U.S. PATENT DOCUMENTS 8,988,871 B2 3/2015 Iwamoto et al.
2014/0063727 A1 3/2014 Iwamoto et al.
(Continued)

FOREIGN PATENT DOCUMENTS

JP H07-198740 A 8/1995
JP 2006-214846 A 8/2006
(Continued)

*Primary Examiner* — Pete T Lee
(74) *Attorney, Agent, or Firm* — Allen & Overy LLP

(57) ABSTRACT

According to one embodiment, a vibration detecting device includes a housing, a vibration sensor, a circuit board, a flexible wiring member, and an elastic member. The vibration sensor is accommodated in the housing. The circuit board is accommodated in the housing, and is provided with a first electric component configured to process a detection signal of the vibration sensor. The wiring member electrically connects the vibration sensor and the circuit board to each other. The elastic member contains a polymer material, and is accommodated in the housing as being in contact with the housing and the circuit board, and being detachable from the housing. The circuit board is held by the housing through the elastic member.

16 Claims, 16 Drawing Sheets

(51) Int. Cl.
  *H05K 1/02* (2006.01)
  *H05K 1/14* (2006.01)
  *H05K 1/18* (2006.01)
  *H05K 5/00* (2006.01)

(56) References Cited

U.S. PATENT DOCUMENTS

| | | | |
|---|---|---|---|
| 2014/0182376 A1* | 7/2014 | Watanabe | G01D 11/245 |
| | | | 73/866.5 |
| 2016/0041068 A1 | 2/2016 | Wascat et al. | |
| 2017/0034827 A1 | 2/2017 | Naiki et al. | |
| 2019/0101420 A1 | 4/2019 | Ninomiya et al. | |
| 2021/0100100 A1* | 4/2021 | Yin | H05K 1/148 |

FOREIGN PATENT DOCUMENTS

| | | |
|---|---|---|
| JP | 3908379 B2 | 4/2007 |
| JP | 2010-008134 A | 1/2010 |
| JP | 4732500 B2 | 7/2011 |
| JP | 2012-243371 A | 12/2012 |
| JP | 2014-063469 A | 4/2014 |
| JP | 2017-032275 A | 2/2017 |
| JP | 2019-066352 A | 4/2019 |
| WO | 2016/194702 | 12/2016 |

\* cited by examiner

FIG.12
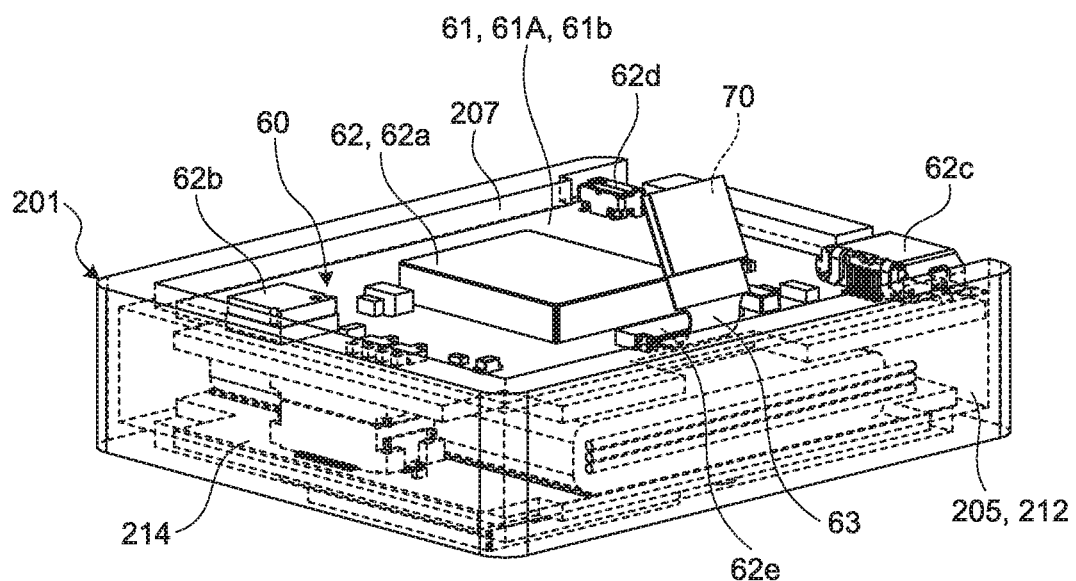
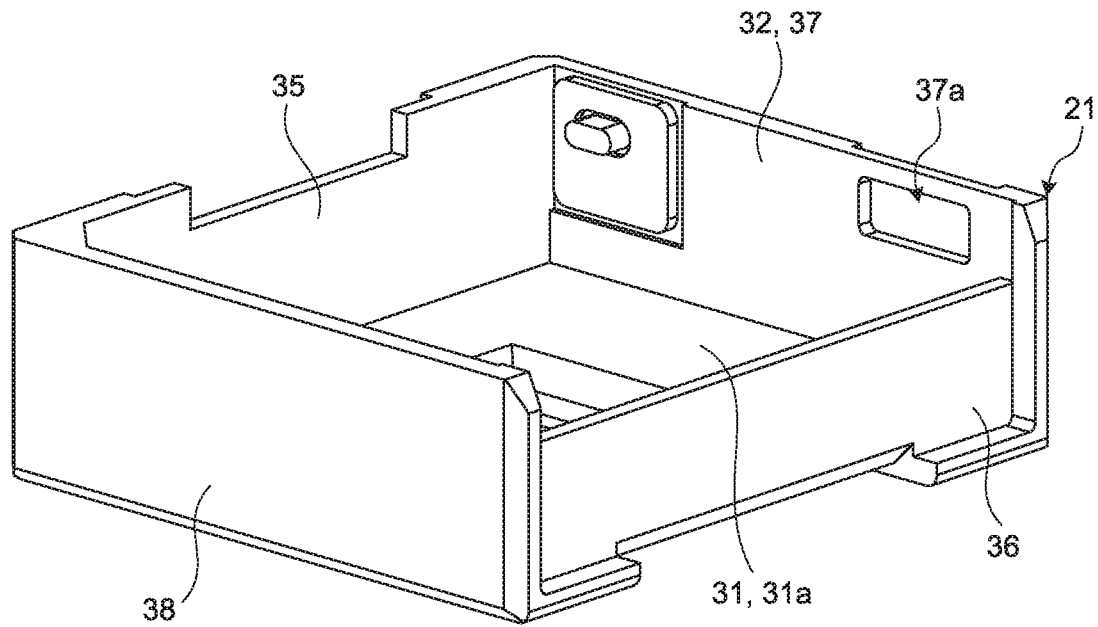
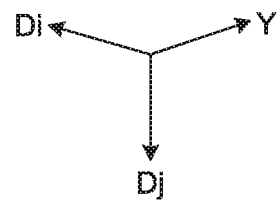

VIBRATION DETECTING DEVICE

CROSS-REFERENCE TO RELATED APPLICATIONS

This application is based upon and claims the benefit of priority from Japanese Patent Application No. 2019-122088, filed on Jun. 28, 2019; the entire contents of which are incorporated herein by reference.

FIELD

Embodiments described herein relate generally to a vibration detecting device.

BACKGROUND

Conventionally, vibration detecting devices are known, which detect vibration with a vibration sensor attached to an intended object.

It is beneficial to provide a vibration detecting device of a novel structure with less inconvenience.

BRIEF DESCRIPTION OF THE DRAWINGS

FIG. 12 is an exemplary perspective view illustrating a front case, a board assembly, and a buffer member, according to a third embodiment, in an exploded manner;

DETAILED DESCRIPTION

In general, according to one embodiment, a vibration detecting device includes a housing, a vibration sensor, a circuit board, a flexible wiring member, and an elastic member. The vibration sensor is accommodated in the housing. The circuit board is accommodated in the housing, and is equipped with a first electric component. The first electric component is configured to process a detection signal of the vibration sensor. The wiring member electrically connects the vibration sensor and the circuit board to each other. The elastic member contains a polymer material, and is accommodated in the housing in contact with the housing and the circuit board, and is detachable from the housing. The circuit board is held by the housing through the elastic member.

First Embodiment

First, an explanation will be given of a first embodiment with reference to FIGS. 1 to 9. In the present specification, a plurality of expressions may be used in terms of a constituent element according to an embodiment and description on the element. The constituent elements and description thereof are merely exemplary, and are not limited by the expressions given in the present specification. A constituent element may be identified with a name different from that in the present specification. Further, a constituent element may be described by using an expression different from that in the present specification.

Figure 1:
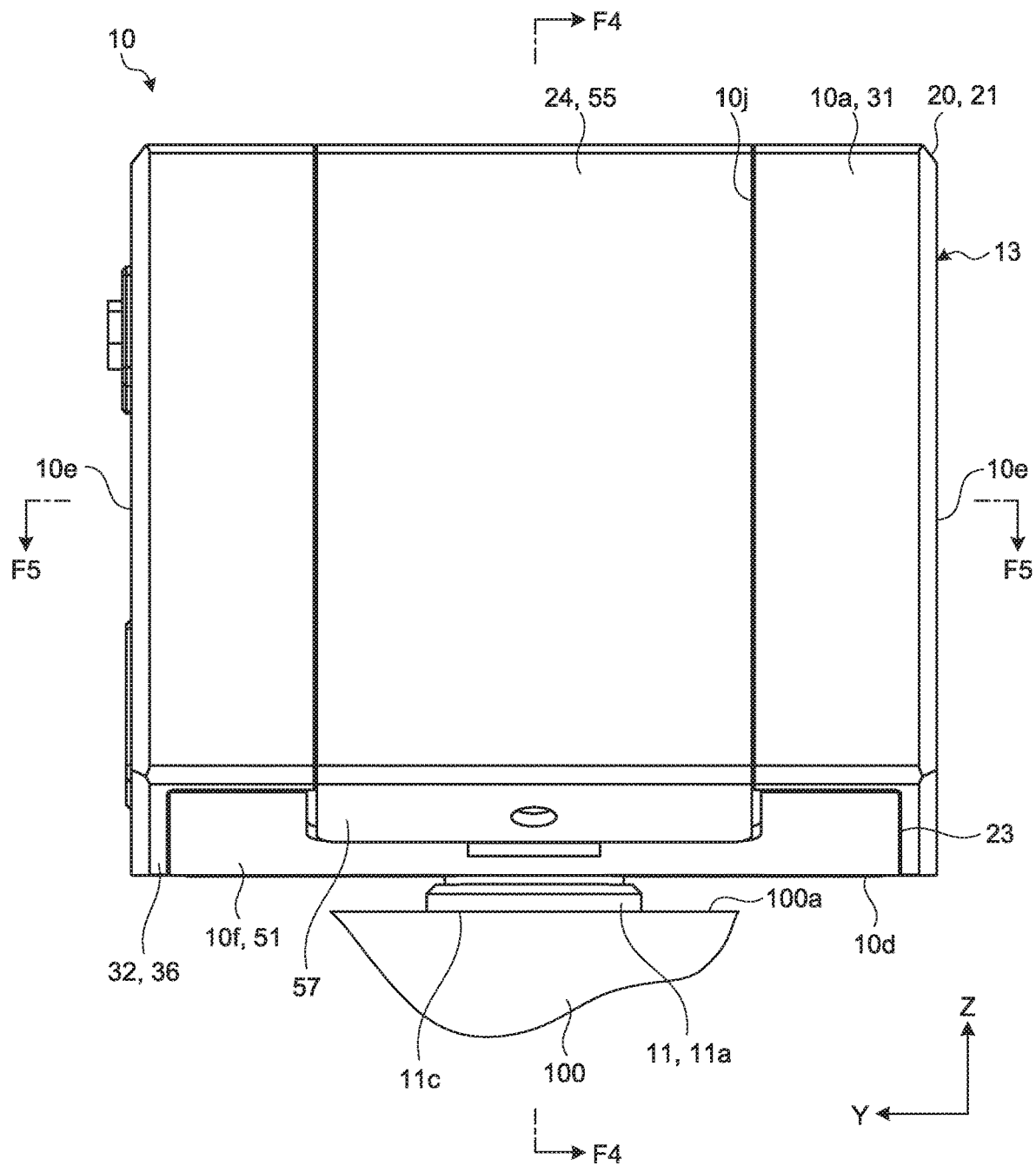
FIG. 1 is an exemplary front view illustrating a vibration detecting device according to a first embodiment.
Figure 2:
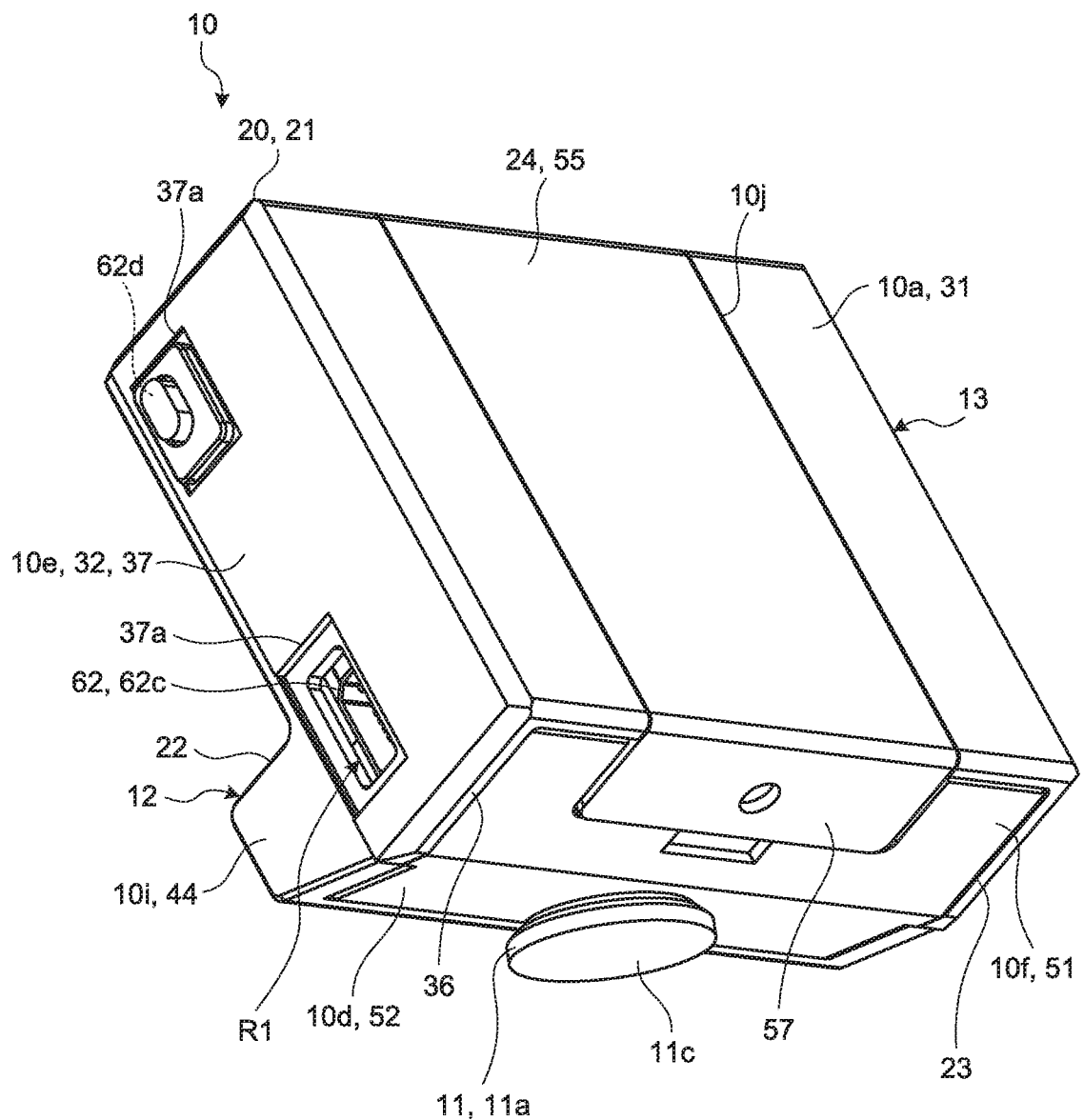
FIG. 2 is an exemplary perspective view illustrating the vibration detecting device of the first embodiment.
Figure 3:
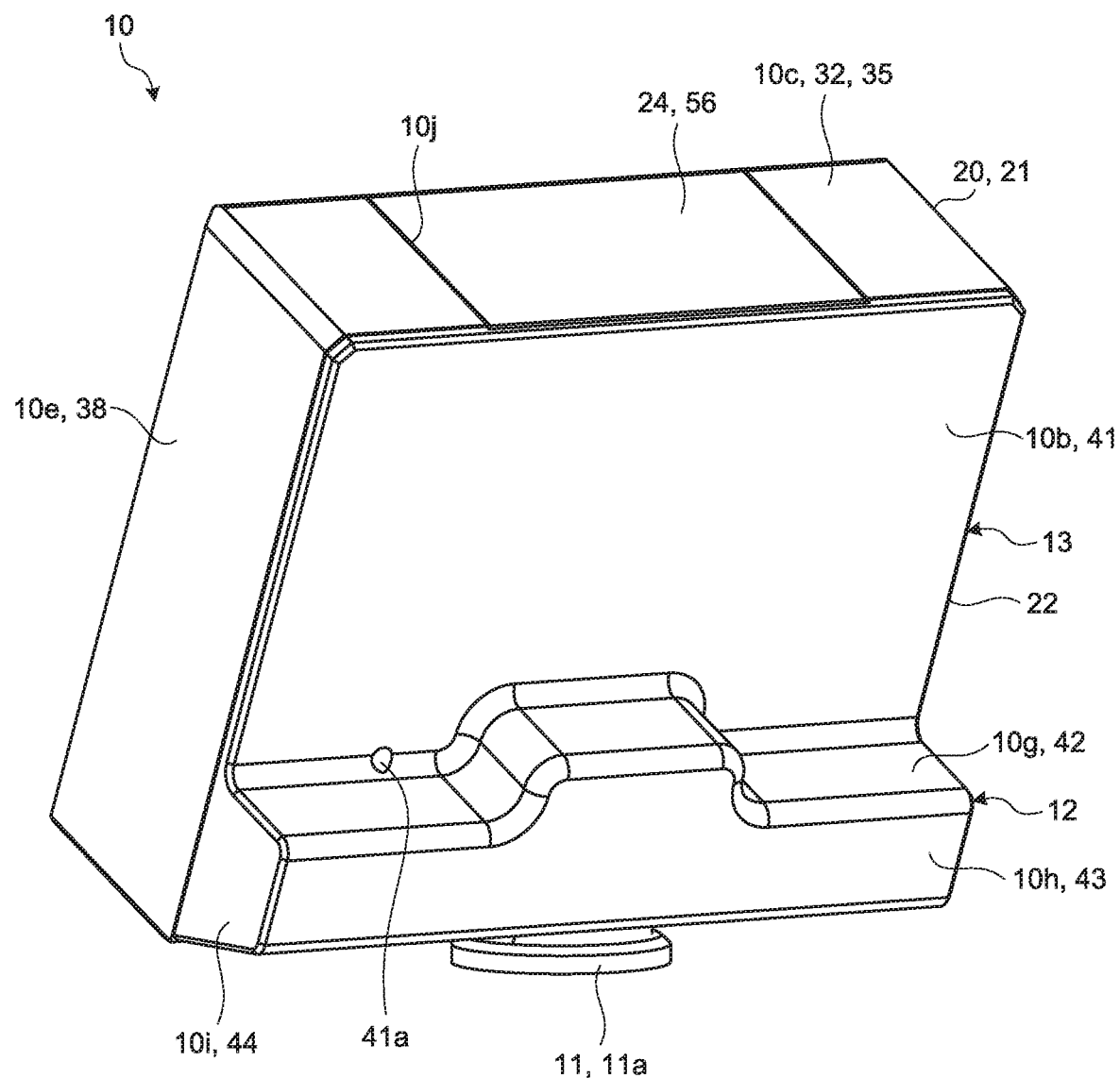
FIG. 3 is an exemplary perspective view illustrating the vibration detecting device of the first embodiment, from an angle different from that of FIG. 2.

FIG. 1 is an exemplary front view illustrating a vibration detecting device 10 according to the first embodiment. FIG. 2 is an exemplary perspective view illustrating the vibration detecting device 10 of the first embodiment. FIG. 3 is an exemplary perspective view illustrating the vibration detecting device 10 of the first embodiment, from an angle different from that of FIG. 2.

As illustrated in FIG. 1, the vibration detecting device 10 is attached to a surface 100a of an intended object 100, to detect vibration of the object 100, for example. As illustrated in FIGS. 1 to 3, the vibration detecting device 10 includes an attachment 11, a base 12, and an overhang 13.

As illustrated in the respective figures, in the present specification, an X-axis, a Y-axis, and a Z-axis are defined for the sake of convenience. The X-axis, the Y-axis, and the Z-axis are orthogonal to one another. The X-axis is along the depth of the vibration detecting device 10. The Y-axis is along the width of the vibration detecting device 10. The Z-axis is along the height of the vibration detecting device 10.

Further, in the present specification, an X direction, a Y direction, and a Z direction are defined. The X direction is along the X-axis, and includes a +X direction indicated by the arrow of the X-axis, and a −X direction opposite to the arrow of the X-axis. The Y direction is along the Y-axis, and includes a +Y direction indicated by the arrow of the Y-axis, and a −Y direction opposite to the arrow of the Y-axis. The Z direction is along the Z-axis, and includes a +Z direction indicated by the arrow of the Z-axis, and a −Z direction opposite to the arrow of the Z-axis.

Further, in the present specification, a Di direction and a Dj direction are defined. The Di direction, the Dj direction, and the Y direction are orthogonal to one another. The Di direction is a direction in which the overhang 13 extends, and includes a +Di direction indicated by an arrow Di, and a −Di direction as the direction opposite to the arrow Di. The Dj direction is the thickness direction of the overhang 13, and is orthogonal to the Di direction. The Dj direction includes a +Dj direction indicated by an arrow Dj, and a −Dj direction opposite to the arrow Dj.

In this embodiment, the surface 100a of the object 100 is a substantially flat surface that is orthogonal to the Z-axis and faces in the +Z direction. However, the surface 100a is not limited to this example. For example, the vibration detecting device 10 may be attached to a curved surface 100a.

In the examples of the respective figures, the +Z direction is vertically upward, the −Z direction is vertically downward, and the X direction and the Y direction are horizontal directions. However, the X direction, the Y direction, and the Z direction are not limited to this example. For example, the vibration detecting device 10 may be attached to a surface 100a that faces vertically downward, in the horizontal direction, or in another direction. In other words, the positions and orientations of the vibration detecting device 10 and the surface 100a of the object 100 to which this vibration detecting device 10 is attached are not limited to specific ones, but may be selectively set from various positions and orientations.

Figure 4:
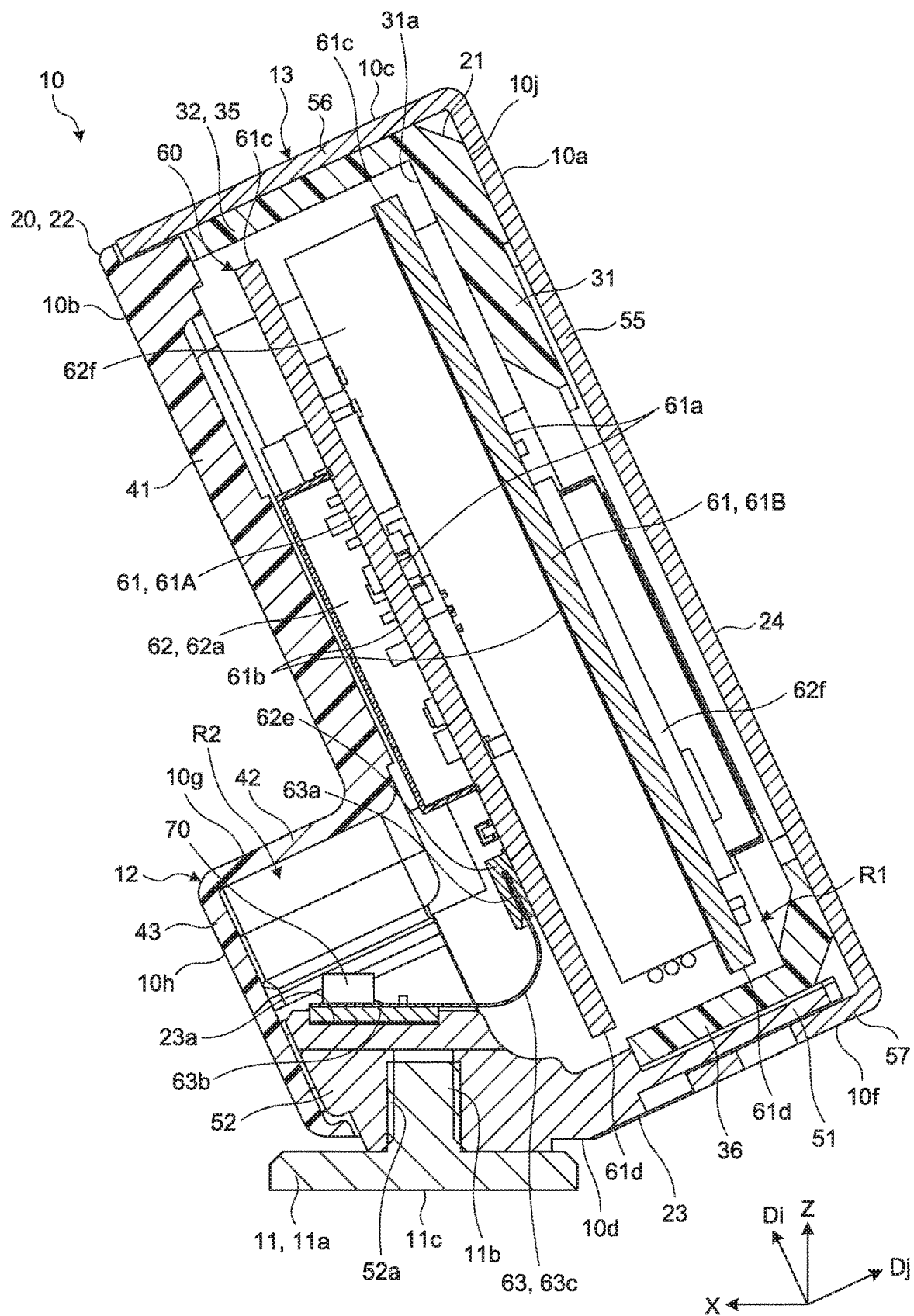
FIG. 4 is an exemplary sectional view illustrating the vibration detecting device of the first embodiment, which is taken along a line F4-F4 of FIG. 1.

FIG. 4 is an exemplary sectional view illustrating the vibration detecting device 10 of the first embodiment, which is taken along a line F4-F4 of FIG. 1. As illustrated in FIG. 4, the attachment 11 includes a stationary part 11a and a male screw 11b.

As illustrated in FIG. 1, the stationary part 11a has a substantially disk shape and is fixed to the surface 100a of the object 100. The stationary part 11a has a substantially flat attaching surface 11c that is orthogonal to the Z direction and faces in the −Z direction. The attaching surface 11c is fixed to the surface 100a by, for example, adhesion. The attachment 11 and the vibration detecting device 10 are thereby fixed to the object 100. The attachment 11 may also be referred to as bracket. As illustrated in FIG. 4, the male screw 11b protrudes from the stationary part 11a in the +Z direction.

The base 12 is detachably connected to the attachment 11. The base 12 protrudes in the +X direction from the −Di directional end of the overhang part 13. In other words, the overhang part 13 protrudes in the +Di direction from the −X directional end of the base 12.

The base 12 and the overhang 13 together form a substantially L-shape or substantially V-shape. The Di direction is slanted with respect to the Z direction. For example, the angle between the Z direction and the Di direction is an acute angle. Thus, the overhang part 13 extends obliquely from the base 12 with respect to the Z direction in which the attaching surface 11c faces.

The overhang part 13 has a flat rectangular parallelepiped shape. For example, the length (width) of the overhang part 13 in the Y direction is substantially constant. The length (thickness) of the overhang part 13 in the Dj direction is substantially constant. The shape of the overhang 13 is not limited to this example.

As illustrated in FIGS. 1 to 4, the vibration detecting device 10 includes outer surfaces, i.e., a front surface 10a, a rear surface 10b, a top surface 10c, a bottom surface 10d, lateral surfaces 10e, a front lower surface 10f, a rear upper surface 10g, a rear end surface 10h, and rear lateral surfaces 10i. Throughout the present specification, expressions representing directions, such as front, rear, upper, lower, top, bottom, and lateral, are used with reference to the accompanying drawings for the sake of convenience, and they are not intended to limit the position and direction of each element. For example, the top surface 10c may be located below the bottom surface 10d in the vertical direction.

The front surface 10a is located at the end of the overhang 13 in the +Dj direction and is substantially orthogonal to the Dj direction. The rear surface 10b is located at the end of the overhang 13 in the −Dj direction and is substantially orthogonal to the Dj direction.

The top surface 10c is located at the end of the overhang 13 in the +Di direction and is substantially orthogonal to the Di direction. The bottom surface 10d is located at the end of the base 12 in the −Z direction and is substantially orthogonal to the Z direction. The bottom surface 10d is substantially parallel to the surface 100a of the object 100 and the attaching surface 11c of the attachment 11.

The lateral surfaces 10e are located at the opposite ends of the overhang 13 in the Y direction and are substantially orthogonal to the Y direction. The front lower surface 10f is located at the end of the overhang 13 in the −Di direction and is substantially orthogonal to the Di direction.

The rear upper surface 10g is located at the end of the base 12 in the +Di direction and is substantially orthogonal to the Di direction. The rear end surface 10h is located at the end of the base 12 in the −Dj direction and is substantially orthogonal to the Dj direction. The rear lateral surfaces 10i are located at the opposite ends of the base 12 in the Y direction and are substantially orthogonal to the Y direction.

The vibration detecting device 10 includes a housing 20. The housing 20 includes a front case 21, a back cover 22, a bottom frame 23, and a shield 24. The front case 21 is an example of a box member. The back cover 22 is an example of a lid member.

Each of the front case 21 and the back cover 22 is made of a material having electromagnetic-wave transmittivity, such as a synthetic resin material or elastomer. Each of the bottom frame 23 and the shield 24 is made of a metal material having an electromagnetic-wave shielding property, such as an aluminum alloy (aluminum-based material), stainless steel (iron-based material), or magnesium alloy (magnesium-based material). The materials of the front case 21, the back cover 22, the bottom frame 23, and the shield 24 are not limited to this example.

The front case 21 includes a front wall 31 and a peripheral wall 32. The front wall 31 is substantially orthogonal to the Dj direction, and forms part of the front surface 10a of the vibration detecting device 10. The front wall 31 includes a substantially flat inner surface 31a that faces in the −Dj direction. The peripheral wall 32 has a substantially rectangular frame shape, and protrudes in the −Dj direction from the inner surface 31a. The peripheral wall 32 includes an upper wall 35, a lower wall 36, a left wall 37, and a right wall 38.

The upper wall 35 protrudes from the end of the inner surface 31a in the +Di direction. The upper wall 35 is substantially orthogonal to the Di direction, and forms part of the top surface 10c of the vibration detecting device 10. The lower wall 36 protrudes from the end of the inner surface 31a in the −Di direction. The lower wall 36 is substantially orthogonal to the Di direction, and forms part of the front lower surface 10f. Thus, the lower wall 36 is separated from the upper wall 35 in the −Di direction along the inner surface 31a.

The left wall 37 protrudes from the end of the inner surface 31a in the +Y direction. The left wall 37 is substantially orthogonal to the Y direction, and forms one of the lateral surfaces 10e of the vibration detecting device 10. The right wall 38 protrudes, from the end of the inner surface 31a in the −Y direction. The right wall 38 is substantially orthogonal to the Y direction, and forms the other of the lateral surfaces 10e of the vibration detecting device 10. Thus, the right wall 38 is separated from the left wall 37 in the −Y direction along the inner surface 31a. The left wall 37 and the right wall 38 connect the opposite ends of the upper wall 35 to the opposite ends of the lower wall 36 in the Y direction.

The lengths (protruding amounts) of the upper wall 35, the left wall 37, and the right wall 38 in the Dj direction are substantially equal to each other. In the Dj direction the length of the lower wall 36 is shorter than the respective lengths of the upper wall 35, the left wall 37, and the right wall 38. The upper wall 35, the lower wall 36, the left wall 37, and the right wall 38 may have the same length or different lengths from one another.

As described above, the front case 21 has a box shape with an open end in the −Dj direction. Consequently, the front case 21 is provided with a first compartment R1 inside. The first compartment R1 is defined by the front wall 31 and the peripheral wall 32.

As illustrated in FIG. 2, the left wall 37 of the front case 21 is provided with a plurality of first holes 37a. Each of the first holes 37a is an example of a first opening. Each first hole 37a penetrates the left wall 37, and allows the first compartment R1 to communicate with the outside of the housing 20. Each first hole 37a is not limited to a hole, but may be a cutout, for example.

As illustrated in FIG. 3, the back cover 22 includes a rear wall 41, a rear upper wall 42, a rear end wall 43, and rear lateral walls 44. The rear wall 41 is substantially orthogonal to the Dj direction, and forms the rear surface 10b of the vibration detecting device 10. The rear upper wall 42 protrudes from the end of the rear wall 41 in the −Dj direction. The rear upper wall 42 is substantially orthogonal to the Di direction, and forms the rear upper surface 10g. The rear end wall 43 protrudes from the end of the rear upper wall 42 in the −Dj direction. The rear end wall 43 is substantially orthogonal to the Dj direction, and forms the rear end surface 10h. The rear lateral walls 44 are connected to the opposite ends of the rear upper wall 42 and the rear end wall 43 in the Y direction. The rear lateral walls 44 are substantially orthogonal to the Y direction, and form the rear lateral surfaces 10i.

The rear wall 41 is provided with a hole 41a. The hole 41a penetrates the rear wall 41, and allows the first compartment R1 to communicate with the outside of the housing 20. The hole 41a is not limited to a hole, but may be a cutout, for example.

The back cover 22 is attached to the −Dj directional end of the peripheral wall 32 by, for example, an adhesive. Consequently, the back cover 22 closes the first compartment R1 inside the front case 21.

As illustrated in FIG. 4, the rear upper wall 42, the rear end wall 43, and the rear lateral walls 44 of the back cover 22 have a box shape with open ends in the +Dj direction and the −Z direction. Consequently, the back cover 22 is provided with a second compartment R2 inside. The second compartment R2 is a space defined by the rear upper wall 42, the rear end wall 43, and the rear lateral walls 44. The second compartment R2 communicates with the end of the first compartment R1 in the −Di direction.

The bottom frame 23 includes a front lower wall 51 and a bottom wall 52. The front lower wall 51 is substantially orthogonal to the Di direction, and forms part of the front lower surface 10f of the vibration detecting device 10. The bottom wall 52 protrudes in the +X direction from the −Dj directional end of the front lower wall 51. The bottom wall 52 is substantially orthogonal to the Z direction, and forms the bottom surface 10d. The bottom wall 52 is provided with a female screw 52a to which the male screw 11b of the attachment 11 is detachably fastened.

The front lower wall 51 of the bottom frame 23 is attached to the lower wall 36 of the front case 21. Consequently, the bottom frame 23 is attached to the front case 21, and the bottom wall 52 of the bottom frame 23 closes the second compartment R2 of the back cover 22.

The shield 24 is fitted to a groove 10j extending in the front surface 10a, the top surface 10c, and the front lower surface 10f. The groove 10j and the shield 24 are provided at substantially the center of the front case 21 in the Y direction. The shield 24 includes a front cover wall 55, an upper cover wall 56, and a lower cover wall 57.

The front cover wall 55 is substantially orthogonal to the Dj direction, and forms part of the front surface 10a of the vibration detecting device 10. The upper cover wall 56 protrudes in the −Dj direction from the +Di directional end of the front cover wall 55. The upper cover wall 56 is substantially orthogonal to the Di direction, and forms part of the top surface 10c. The lower cover wall 57 protrudes in the −Dj direction from the −Di directional end of the front cover wall 55. The lower cover wall 57 is substantially orthogonal to the Di direction, and forms part of the front lower surface 10f.

The base 12 of the vibration detecting device 10 includes the rear upper wall 42, the rear end wall 43, and the rear lateral walls 44 of the back cover 22, and the bottom wall 52 of the bottom frame 23. The overhang 13 includes the front wall 31 and the peripheral wall 32 of the front case 21, the rear wall 41 of the back cover 22, the front lower wall 51 of the bottom frame 23, and the front cover wall 55, the upper cover wall 56, and the lower cover wall 57 of the shield 24. The first compartment R1 is provided at the overhang 13 inside the housing 20, and the second compartment R2 is provided at the base 12 inside the housing 20.

The vibration detecting device 10 includes a board assembly 60. The board assembly 60 includes a plurality of circuit boards 61, a plurality of electric components 62, and a flexible printed wiring board (flexible printed circuit board; FPC) 63. The FPC 63 is an example of a wiring member. The number of circuit boards 61 in the board assembly 60 may be one or three or more. Further, the wiring member is not limited to the FPC 63, but may be another wiring member with flexibility, such as a flexible flat cable or a plurality of cables.

Each of the circuit boards 61 is a printed circuit board (PCB), for example. Each circuit board 61 may be another circuit board, such as a FPC. Further, the circuit boards 61 may include a plurality of types of circuit board 61.

The circuit boards 61 are electrically connected to each other through, for example, a connector, and are accommodated in the first compartment R1 inside the housing 20. Thus, the inner surface 31a of the front wall 31 of the front case 21 faces the circuit boards 61. The peripheral wall 32 surrounds the circuit boards 61.

The circuit boards 61 have a substantially rectangular plate shape substantially orthogonal to the Dj direction. The circuit boards 61 may have another shape, such as a circular shape. The circuit boards 61 are arranged with a gap along the thickness (in Dj direction).

In this embodiment, the circuit boards 61 include a circuit board 61A and a circuit board 61B. The circuit board 61A is closer to the rear wall 41 than the circuit board 61B is. The circuit boards 61A and 61B have substantially the same sizes. The circuit boards 61 may include a plurality of circuit boards 61 having sizes different from each other.

Figure 5:
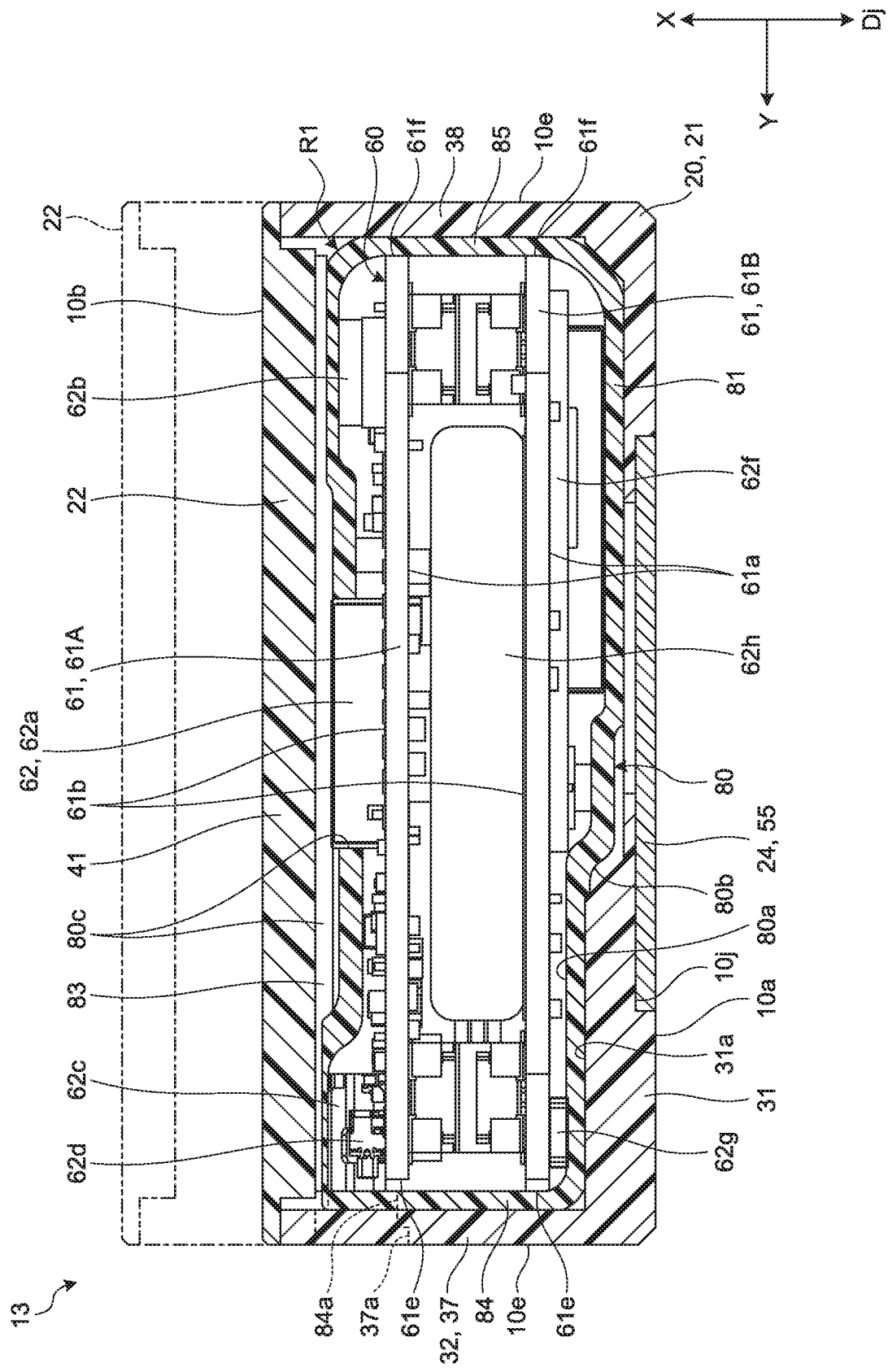
FIG. 5 is an exemplary sectional view illustrating the vibration detecting device of the first embodiment, which is taken along a line F5-F5 of FIG. 1.

FIG. 5 is an exemplary sectional view illustrating the vibration detecting device 10 of the first embodiment, which is taken along a line F5-F5 of FIG. 1. As illustrated in FIGS. 4 and 5, each of the circuit boards 61 includes a front surface 61*a*, a rear surface 61*b*, an upper end 61*c*, a lower end 61*d*, a left end 61*e*, and a right end 61*f*. The rear surface 61*b* of the circuit board 61A is an example of a first surface. The front surface 61*a* of the circuit board 61B is an example of a second surface. The upper end 61*c* of each of the circuit boards 61A and 61B is an example of a first end. The lower end 61*d* of each of the circuit boards 61A and 61B is an example of a second end. The left end 61*e* of each of the circuit boards 61A and 61B is an example of a third end. The right end 61*f* of each of the circuit boards 61A and 61B is an example of a fourth end.

The front surface 61*a* is substantially flat, and faces in the +Dj direction. The rear surface 61*b* is substantially flat, and faces in the −Dj direction. The rear surface 61*b* is opposite to the front surface 61*a*. The front surface 61*a* of the circuit board 61A faces the rear surface 61*b* of the circuit board 61B with a gap therebetween. Further, the front surface 61*a* of the circuit board 61B is opposite the rear surface 61*b* of the circuit board 61A in the board assembly 60.

The upper end 61*c* is the +Di directional end of each circuit board 61. The +Di direction is along the front surface 61*a*, and is an example of a first direction. The lower end 61*d* is the −Di directional end of each circuit board 61. The −Di direction is opposite to the +Di direction, and is an example of a second direction. The lower end 61*d* is opposite to the upper end 61*c*. The upper end 61*c* and the lower end 61*d* extend in the Y direction.

The left end 61*e* is the +Y directional end of each circuit board 61. The +Y direction is along the front surface 61*a* and orthogonal to the +Di direction, and is an example of a third direction. The left end 61*e* is located between the end of the upper end 61*c* and the end of the lower end 61*d* in the +Y direction.

The right end 61*f* is the end of each circuit board 61 in the −Y direction. The −Y direction is opposite to the +Y direction, and is an example of a fourth direction. The right end 61*f* is located between the end of the upper end 61*c* in the −Y direction and the end of the lower end 61*d* in the −Y direction. The right end 61*f* is opposite to the left end 61*e*. The left end 61*e* and the right end 61*f* extend in the Di direction.

The electric components 62 include a micro controller unit (MCU) 62*a*, a first wireless unit 62*b*, an external connector 62*c*, an external operation switch 62*d*, a connector 62*e*, a second wireless unit 62*f*, an antenna 62*g*, and a battery 62*h*. The MCU 62*a* is an example of a first electric component. Each of the external connector 62*c* and the external operation switch 62*d* is an example of a second electric component.

The MCU 62*a*, the first wireless unit 62*b*, the external connector 62*c*, the external operation switch 62*d*, and the connector 62*e* are mounted on the rear surface 61*b* of the circuit board 61A. The MCU 62*a* is placed in substantially the center of the rear surface 61*b* in the Y direction. The first wireless unit 62*b* is placed at the end of the rear surface 61*b* in the −Y direction. The external connector 62*c* and the external operation switch 62*d* are arranged at the end of the rear surface 61*b* in the +Y direction. The connector 62*e* is placed at the end of the rear surface 61*b* in the −Di direction.

The second wireless unit 62*f* and the antenna 62*g* are mounted on the front surface 61*a* of the circuit board 61B.

The antenna 62*g* is placed at the end of the front surface 61*a* in the +Y direction. The battery 62*h* is mounted on the front surface 61*a* of the circuit board 61A or the rear surface 61*b* of the circuit board 61B.

The first wireless unit 62*b* incorporates an antenna, and communicates data in compliance with, for example, the Bluetooth (registered trademark) low energy (BLE) standard. The second wireless unit 62*f* executes data communication via the antenna 62*g* in compliance with, for example, long range wide area network (LoRaWAN) (registered trademark) standard.

The first wireless unit 62*b* and the antenna 62*g* are covered with the front case 21 and the back cover 22 having electromagnetic-wave transmittivity. Consequently, the wireless communication between the first wireless unit 62*b* and the antenna 62*g* cannot be jammed.

The MCU 62*a* is covered with the shield 24 through the front case 21. Consequently, the MCU 62*a* can be prevented from being affected by noise. Further, the shield 24 is located between the first wireless unit 62*b* and the antenna 62*g* in the Y direction to reduce interference between a communication signal of the first wireless unit 62*b* and a communication signal of the antenna 62*g*.

As illustrated in FIG. 4, the FPC 63 is connected to the circuit board 61A through the connector 62*e*. The FPC 63 is accommodated in the first compartment R1 and the second compartment R2 inside the housing 20. In other words, the FPC 63 extends across the first compartment R1 and the second compartment R2.

The FPC 63 has flexibility and extends between a first end 63*a* and a second end 63*b* in a flexural manner. The first end 63*a* is inside the first compartment R1, and is inserted into the connector 62*e*. The second end 63*b* is inside the second compartment R2.

The vibration detecting device 10 further includes a vibration sensor 70. The vibration sensor 70 is mounted at the second end 63*b* of the FPC 63. The vibration sensor 70 is accommodated in the second compartment R2 inside the housing 20. Further, the FPC 63 electrically connects the vibration sensor 70 to the circuit board 61A.

For example, the vibration sensor 70 is a shock sensor. The vibration sensor 70 may be another vibration sensor, such as a piezoelectric vibration sensor, micro electro mechanical systems (MEMS) vibration sensor, or tri-axial acceleration sensor.

The vibration sensor 70 outputs a detection signal to the MCU 62*a* through the FPC 63. The MCU 62*a* processes the detection signal of the vibration sensor 70, and controls the first wireless unit 62*b* and the second wireless unit 62*f* to wirelessly transmit a signal in accordance with this detection signal. The MCU 62*a* is not limited to this example.

At least one of the vibration sensor 70 and the second end 63*b* is directly or indirectly attached to a mounting surface 23*a* of the bottom frame 23 with, for example, an adhesive or a sealing material. The mounting surface 23*a* is located in the second compartment R2. Specifically, in the second compartment R2, the periphery of the vibration sensor 70 is covered by the adhesive or sealing material and thereby fixed so as not to move. Further, the adhesive or sealing material around the vibration sensor 70 work to reduce transmission of vibration to the vibration sensor 70 from parts or elements other than the mounting surface 23*a*.

The FPC 63 includes a bend 63*c* between the first end 63*a* and the second end 63*b*. The FPC 63 is separated from the housing 20 at least in the vicinity of the bend 63*c*. Thereby, the FPC 63 is changeable in shape (position, radius of curvature, etc.) at the bend 63c, and can restrict transmission of vibration from the housing 20 to the vibration sensor 70 through the FPC 63.

As illustrated in FIG. 5, the vibration detecting device 10 further includes a flexible sheet 80. The sheet 80 is an example of an elastic member. FIG. 4 omits depicting the sheet 80. The sheet 80 can be of a plate form, layer form, or film form, and be a member spreadable to be orthogonal to or intersect with a desired direction. The sheet 80 may also be referred to as buffer material.

For example, the sheet 80 is made of a gel, such as αGEL (registered trademark). In other words, the sheet 80 is made of a polymer material. The sheet 80 may be made of another gel, a synthetic resin such as silicone or elastomer, a sponge, or another polymer material having flexibility. The sheet 80 is substantially transparent, for example, but may have a color.

The sheet 80 is flexible and stretchable. Specifically, the sheet 80 is lower in longitudinal elastic modulus and in shear elastic modulus (rigidity modulus) than the housing 20 and the circuit boards 61, and is easily stretchable and bendable. The sheet 80 is not limited to this example.

The sheet 80 is bent to wrap around the circuit boards 61, and is accommodated together with the circuit boards 61 in the first compartment R1 inside the housing 20. The sheet 80 is in contact with the housing 20 and the circuit boards 61 and separable or detachable therefrom. The sheet 80 is interposed between the housing 20, and each of the rear surface 61b of the circuit board 61A, the front surface 61a of the circuit board 61B, and the upper end 61c, the lower end 61d, the left end 61e, and the right end 61f of each of the circuit boards 61A and 61B. Consequently, the circuit boards 61 are held by the housing 20 through the sheet 80 at positions separated from the housing 20.

Figure 6:
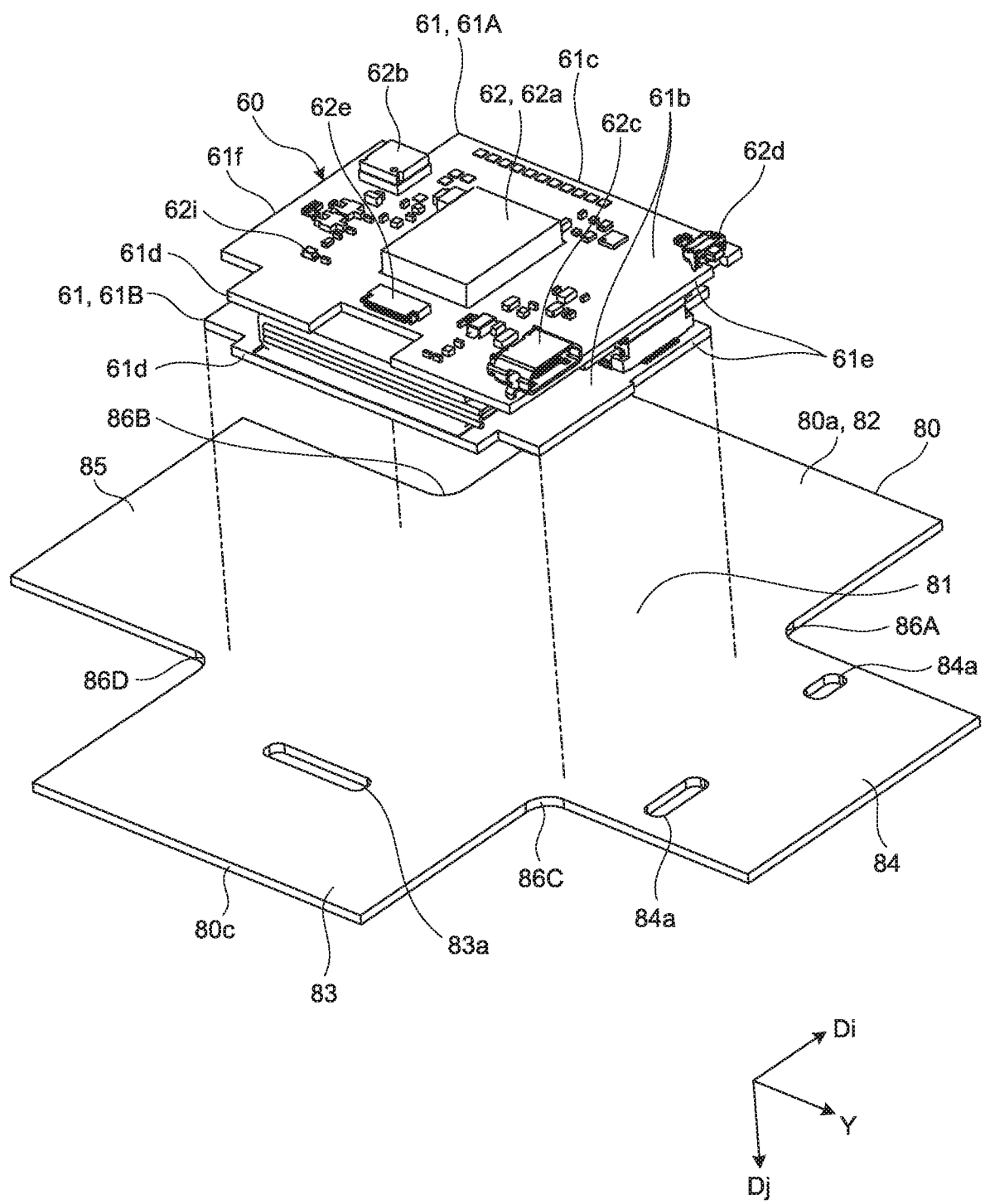
FIG. 6 is an exemplary perspective view illustrating a board assembly and a sheet in the first embodiment.

FIG. 6 is an exemplary perspective view illustrating the board assembly 60 and the sheet 80 in the first embodiment. As illustrated in FIG. 6, the sheet 80 of this embodiment, when spread, has a substantially cross shape, and includes a base 81, an upper extension 82, a lower extension 83, a left extension 84, and a right extension 85. The sheet 80 may have another shape.

The base 81 has a substantially rectangular shape, and covers the front surface 61a of the circuit board 61B. The base 81 has substantially the same size as the circuit board 61B. The base 81 may be smaller or larger than the circuit board 61B.

The upper extension 82 extends from the end of the base 81 in the +Di direction. Being bent, the upper extension 82 covers the upper end 61c of each of the circuit boards 61A and 61B and part of the rear surface 61b of the circuit board 61A. The lower extension 83 extends from the end of the base 81 in the −Di direction. Being bent, the lower extension 83 covers the lower end 61d of each of the circuit boards 61A and 61B and part of the rear surface 61b of the circuit board 61A.

The left extension 84 extends from the end of the base 81 in the +Y direction. Being bent, the left extension 84 covers the left end 61e of each of the circuit boards 61A and 61B and part of the rear surface 61b of the circuit board 61A. The right extension 85 extends from the end of the base 81 in the −Y direction. Being bent, the right extension 85 covers the right end 61f of each of the circuit boards 61A and 61B and part of the rear surface 61b of the circuit board 61A.

The lower extension 83 is provided with an insertion hole 83a. The insertion hole 83a penetrates the lower extension 83. Further, the left extension 84 is provided with a plurality of second holes 84a. Each of the second holes 84a is an example of a second opening. Each second hole 84a penetrates the left extension 84. The insertion hole 83a and the second holes 84a is not limited to holes, but may be cutouts, for example.

The corner 86A between the upper extension 82 and the left extension 84, the corner 86B between the upper extension 82 and the right extension 85, the corner 86C between the lower extension 83 and the left extension 84, and the corner 86D between the lower extension 83 and the right extension 85 are finished by round chamfering and has a substantially arc shape. Thus, the corners 86A, 86B, 86C, and 86D can be prevented from cracking.

Figure 7:
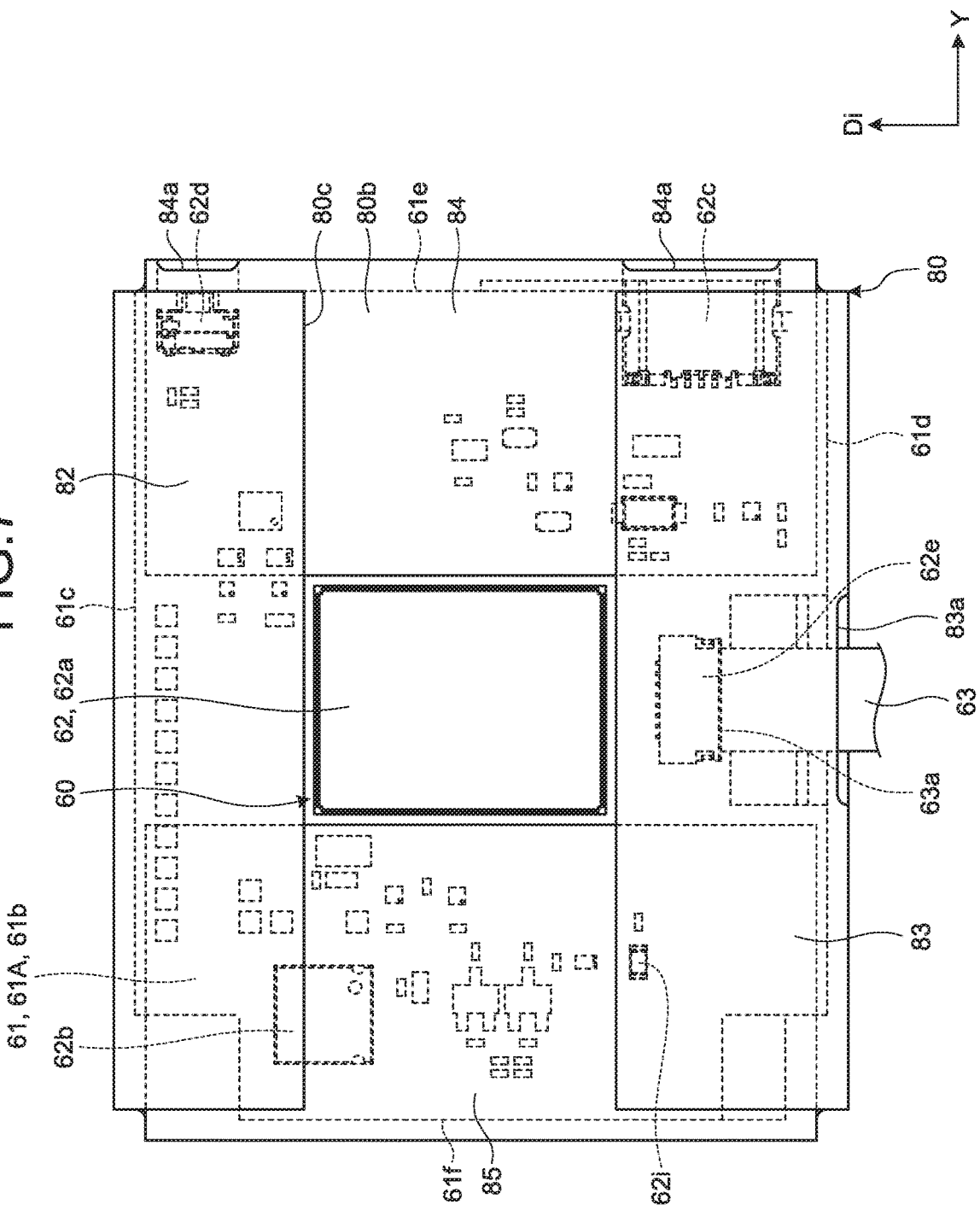
FIG. 7 is an exemplary front view illustrating the board assembly wrapped with the sheet in the first embodiment.

FIG. 7 is an exemplary front view illustrating the board assembly 60 wrapped with the sheet 80 in the first embodiment. The FPC 63 extends between the circuit board 61A and the vibration sensor 70 through the insertion hole 83a. The external connector 62c and the external operation switch 62d are exposed outside the housing 20 through the second holes 84a of the sheet 80 and the first holes 37a of the housing 20. The first holes 37a may be closed by a cover or another component. Further, the external connector 62c and the external operation switch 62d are separated from the housing 20.

Owing to the substantially transparent sheet 80, for example, the circuit boards 61 are visible from outside the housing 20 through the hole 41a of FIG. 3 and the sheet 80. For example, as illustrated in FIG. 6, the light of an LED 62i mounted on the circuit board 61A is visible from outside the housing 20 through the hole 41a and the sheet 80.

As illustrated in FIGS. 5 and 6, the sheet 80 further includes a first surface 80a, a second surface 80b, and an edge 80c. The first surface 80a is an example of a surface. The first surface 80a faces the circuit boards 61. The second surface 80b is opposite to the first surface 80a, and faces the housing 20. The edge 80c is the edge of the sheet 80 in the directions along the first surface 80a. Each of the base 81, the upper extension 82, the lower extension 83, the left extension 84, and the right extension 85 includes part of the first surface 80a, the second surface 80b, and the edge 80c.

The sheet 80 having the above-described shape is produced, for example, by cutting part of a substantially rectangular material. The sheet 80 is not limited to this example, but may be produced in the above shape without cutting.

Next, an exemplary explanation will be given of part of an assembling method of the vibration detecting device 10. The assembling method of the vibration detecting device 10 is not limited to the following method, but the vibration detecting device 10 may be assembled by another method. First, as illustrated in FIG. 6, the board assembly 60 excluding the FPC 63 is assembled. Alternatively, the board assembly 60 including the FPC 63 may be assembled.

Then, the upper extension 82, the lower extension 83, the left extension 84, and the right extension 85 of the sheet 80 are bent to wrap around the circuit boards 61. As illustrated in FIG. 7, the sheet 80 wraps around the circuit boards 61 with the MCU 62a exposed. The MCU 62a may be covered with the sheet 80.

Figure 8:
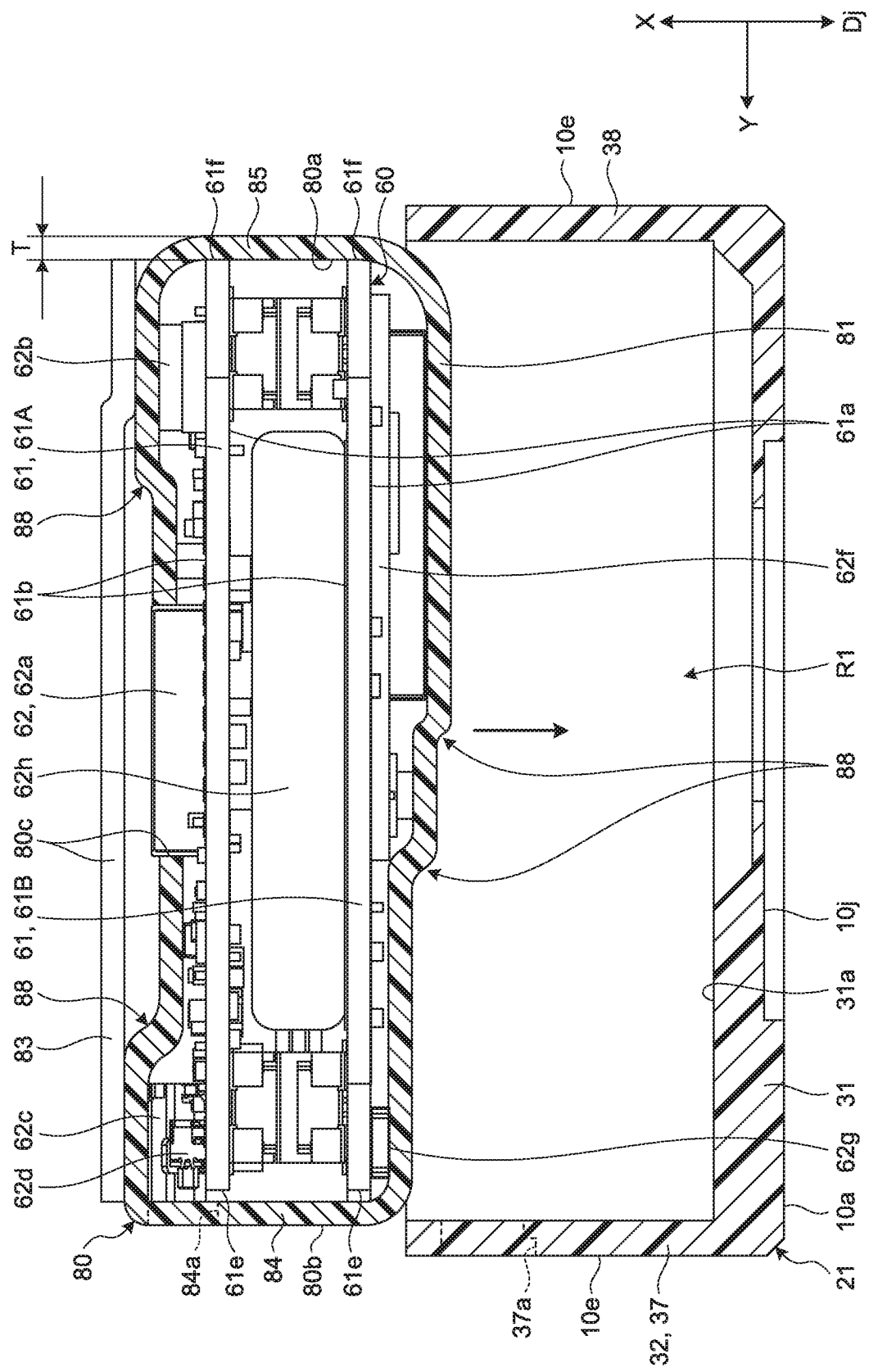
FIG. 8 is an exemplary sectional view illustrating the board assembly wrapped with the sheet together with a front case 21 in the first embodiment.

FIG. 8 is an exemplary sectional view illustrating the board assembly 60 wrapped with the sheet 80 together with the front case 21 in the first embodiment. As illustrated in FIG. 8, the sheet 80 includes a plurality of bends 88 to be in contact with the circuit boards 61 and a plurality of electric components 62. Specifically, being bent at the bends 88, the sheet 80 can be in contact with the circuit boards 61 and a plurality of electric components 62 different in thickness.

The sheet 80 includes mutually overlapping portions. For example, part of the lower extension 83 and part of the left extension 84 are overlapped with each other. Part of the lower extension 83 and part of the right extension 85 are overlapped with each other. Part of the upper extension 82 and part of the left extension 84 are overlapped with each other. Part of the upper extension 82 and part of the right extension 85 are overlapped with each other.

Of the sheet 80, one part and another part of the overlapping portions are in direct contact with each other without an adhesive or a double-sided adhesive tape. Because of this, one part and another part of the overlapping portions of the sheet 80 are separable or detachable from each other. One part and another part of the overlapping portions of the sheet 80 may separably stick to each other by the stickiness of the sheet 80.

Then, the circuit boards 61 and the sheet 80 are press-fitted into the first compartment R1 of the front case 21. Consequently, the sheet 80 is interposed between the housing 20 and each of the front surface 61a of the circuit board 61B and the upper end 61c, the lower end 61d, the left end 61e, and the right end 61f of each of the circuit boards 61A and 61B.

Figure 9:
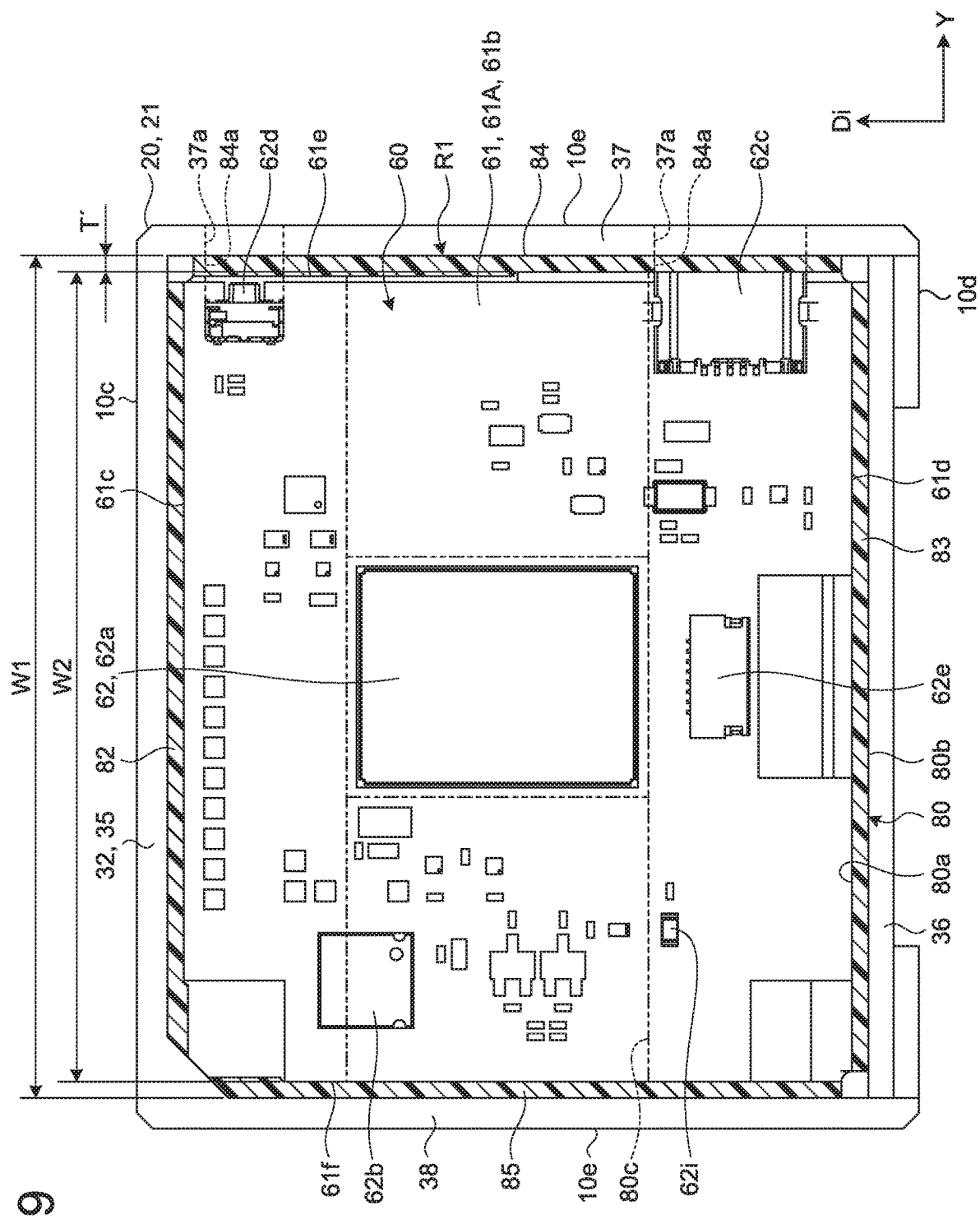
FIG. 9 is an exemplary sectional view illustrating the board assembly and the sheet accommodated in the front case in first embodiment.

FIG. 9 is an exemplary sectional view illustrating the board assembly 60 and the sheet 80 accommodated in the front case 21 in first embodiment. The edge 80c of the upper extension 82, the lower extension 83, the left extension 84, and the right extension 85, which is indicated by a two-dot chain line in FIG. 9, is not fixed, therefore, free. That is, by pressing the upper extension 82, the lower extension 83, the left extension 84, and the right extension 85 with a jig, for example, the sheet 80 is restricted from separating from the board assembly 60 due to the restoring force.

Then, the FPC 63 is inserted into the connector 62e through the insertion hole 83a. The bottom frame 23 is attached to the front case 21. The FPC 63 and the vibration sensor 70 are attached to the bottom frame 23.

Then, as indicated by a two-dot chain line in FIG. 5, the back cover 22 is attached to the front case 21. The back cover 22 is fixed to the front case 21 while the upper extension 82, the lower extension 83, the left extension 84, and the right extension 85 are pressed against the circuit boards 61. In the example of FIG. 5, the back cover 22 is moved in the +Dj direction for attachment to the front case 21. However, for example, the back cover 22 may be rotated around the Y-axis and attached to the front case 21.

The edge 80c of the upper extension 82, the lower extension 83, the left extension 84, and the right extension 85 extends between the circuit boards 61 and the back cover 22. Thus, the back cover 22 works to press the upper extension 82, the lower extension 83, the left extension 84, and the right extension 85 to restrict the the sheet 80 from moving away from the board assembly 60 by the restoring force.

As illustrated in FIG. 9, in the Y direction the distance W1 (the width of the first compartment R1) between the left wall 37 and the right wall 38 is larger than the distance (width) W2 between the left end 61e and the right end 61f of each circuit board 61.

As illustrated in FIG. 8, in the natural, uncompressed state, the distance (thickness) T between the first surface 80a and the second surface 80b of the sheet 80 is larger than a half of the difference between the width W1 and the width W2. Specifically, the relationship between the thickness T, and the width W1 and the width W2 can be expressed by the following Formula 1:

$$T > 1/2(W1 - W2).$$

Due to the dimensional difference described above, while the board assembly 60 and the sheet 80 are accommodated in the first compartment R1, the sheet 80 is compressed between the circuit boards 61 and the housing 20. Thus, the sheet 80 extends between the circuit boards 61 and the housing 20 in a compressed state. The sheet 80 may include a non-compressible part.

As illustrated in FIG. 9, when compressed, the sheet 80 decreases in thickness to a thickness T' about 80% of the thickness T in the natural state, for example. The thickness T' is not limited to this example, but the thickness T' of the sheet 80 is set to exhibit desired vibration absorbing performance.

The dimensional difference described above is not limited to the one between the width W1 between the left wall 37 and the right wall 38 and the width W2 between the left end 61e and the right end 61f of each circuit board 61. The sheet 80 is compressed between the rear surface 61b of the circuit board 61A and the back cover 22, between the front surface 61a of the circuit board 61B and the front wall 31, and between the peripheral wall 32, and the upper end 61c, the lower end 61d, the left end 61e, and the right end 61f of each of the circuit boards 61A and 61B.

Due to the stretching properties, the sheet 80 can be deformed in accordance with the shape of the gap between each circuit board 61 and the housing 20. Consequently, the sheet 80 can come into contact with each circuit board 61, each electric component 62, and the housing 20 in a larger contact area.

In the housing 20 the circuit boards 61 are held by the housing 20 through the bent sheet 80 wrapping around these circuit boards 61. Specifically, the front wall 31 supports the front surface 61a of the circuit board 61B through the sheet 80, the peripheral wall 32 supports the upper end 61c, the lower end 61d, the left end 61e, and the right end 61f of each of the circuit boards 61A and 61B through the sheet 80, and the rear wall 41 supports the rear surface 61b of the circuit board 61A through the sheet 80. Consequently, the movement of the circuit boards 61 is restricted.

The sheet 80 is in direct contact with the housing 20, each circuit board 61, and each electric component 62 without an adhesive or a double-sided adhesive tape. Thus, the sheet 80 is in contact with the housing 20, each circuit board 61, and each electric component 62, and separable (detachable) therefrom. The sheet 80 may separably stick to the housing 20, each circuit board 61, and each electric component 62 by the stickiness of the sheet 80.

As described above, the circuit boards 61 are not fixed to the housing 20 with screws, pins, a double-sided tape, adhesive, or filler, but are held by the housing 20 through the sheet 80 with spacing from the housing 20. That is, the circuit boards 61 are movable relative to the housing 20 by elastic deformation of the sheet 80.

The sheet 80 attenuates vibration and restrains transmission of vibration between the circuit boards 61 and the housing 20. Thus, vibration of the housing 20 can be avoided from being transmitted to the vibration sensor 70 through the circuit boards 61 and the FPC 63. Further, the circuit boards 61 are restrained from being vibrated due to resonance.

Then, the shield 24 is attached to the front case 21 and the bottom frame 23, and the attachment 11 is attached to the bottom frame 23. This completes the assembly of the vibration detecting device 10.

The board assembly 60 may be taken out of the housing 20 after production of the vibration detecting device 10. In this case, the back cover 22 is detached from the front case 21 to open the sheet 80, enabling extraction of the board assembly 60 from the housing 20. That is, in the vibration detecting device 10, the board assembly 60 can be detached from the housing 20 without removal work of adhesive or filler.

In the vibration detecting device 10 according to the first embodiment described above, the circuit boards 61 are held by the housing 20 through the sheet 80. That is, the sheet 80 spreads between the housing 20 and the circuit boards 61 to be able to reduce transmission of vibration between the housing 20 and the circuit boards 61, and attenuate vibration of the circuit boards 61. This can suppress vibration noise due to vibration of the housing 20 transmitted through the circuit boards 61 and/or resonance of the circuit boards 61 from entering the vibration sensor 70, thereby reducing occurrence of malfunctions or failures in the vibration detecting device 10. Further, since the vibration absorbing member is in the form of a sheet, the circuit boards 61 can be more easily detached from the housing 20 than a vibration absorbing material filled in-between the circuit boards 61 and the housing 20, for example. In addition, the circuit boards 61 can be equipped with a member with a hole, such as the external connector 62c, and/or a movable member, such as the external operation switch 62d. Further, the sheet 80 includes the bends, so that the sheet 80 can be easily set in close contact with the circuit boards 61 and the housing 20.

The sheet 80 contains a gel. Specifically, the sheet 80 is lower in shear elastic modulus (rigidity modulus) and is higher in viscosity than a buffer material, such as elastomer or sponge. Consequently, the sheet 80 exhibits higher stretching property to efficiently absorb and attenuate vibration and to spread between the housing 20 and the circuit boards 61 without a gap. This can prevent vibration noise from entering the vibration sensor 70.

The sheet 80 contains αGEL. Consequently, the sheet 80 can efficiently absorb and attenuate vibration and spread between the housing 20 and the circuit boards 61 without a gap. Thus, vibration noise is restrained from entering the vibration sensor 70.

The sheet 80 is bent to wrap around the circuit boards 61, spreading between the housing 20, and each of the front surfaces 61a, the rear surfaces 61b, the left ends 61e, and the right ends 61f. This can restrain the circuit boards 61 from coming into contact with the housing 20, and suppress vibration noise due to vibration of the housing 20 transmitted through the circuit boards 61 and/or resonance of the circuit boards 61 from entering the vibration sensor 70.

The sheet 80 spreads between the circuit boards 61 and the housing 20 in a compressed state. Specifically, the distance between the circuit boards 61 and the housing 20 is smaller than the thickness of the sheet 80 in the natural state. Consequently, the restoring force of the sheet 80 serves to hold the circuit boards 61, and reduce vibration of the circuit boards 61.

The housing 20 is provided with the first holes 37a, and the sheet 80 is provided with the second holes 84a. The external connector 62c is mounted on the circuit boards 61, and is exposed outside the housing 20 through one of the first holes 37a and one of the second holes 84a. Consequently, the external connector 62c is usable from outside the housing 20. For example, the external connector 62c is operable or viewable from outside, and/or another component such as a plug is insertable into the external connector 62c.

The front case 21 of the housing 20 includes the inner surface 31a that faces the circuit boards 61, and the peripheral wall 32 that protrudes from the inner surface 31a and surrounds the circuit boards 61. The back cover 22 is attached to an end of the peripheral wall 32 to close the inside of the front case 21 and to press part of the sheet 80 against one of the circuit boards 61. The back cover 22 presses the sheet 80 in this manner, eliminating the necessity to attach the sheet 80 to the housing 20, the circuit boards 61, or another part of the sheet 80 and reducing hindrance to the vibration absorption and attenuation by the sheet 80.

The sheet 80 includes the first surface 80a that faces the circuit boards 61, and the edge 80c in the directions along the first surface 80a. This edge 80c is located between the circuit boards 61 and the back cover 22. Specifically, the back cover 22 works to press part of the sheet 80 including the edge 80c against one of the circuit boards 61. Consequently, the back cover 22 can be attached to the end of the peripheral wall 32, while pressing the vicinity of the edge 80c of the sheet 80, which is to move away from the circuit boards 61 by the restoring force, against one of the circuit boards 61. This facilitates the assembly of the vibration detecting device 10.

The sheet 80 includes mutually directly contacting, overlapping portions and is in direct contact with the housing 20 and the circuit boards 61. Specifically, the overlapping portions of the sheet 80 are not fixed to each other with a double-sided tape or an adhesive. The contacting part of the sheet 80 with the housing 20 and the circuit boards 61 are not fixed to the housing 20 and the circuit boards 61 with a double-sided tape or an adhesive. Thus, the vibration absorption and attenuation by the sheet 80 cannot be hindered by fixation.

Second Embodiment

Next, an explanation will be given of a second embodiment with reference to FIGS. 10 to 11. In the following description of second to fourth embodiments, the constituent elements having functions substantially the same as those of constituent elements previously described are denoted by reference symbols the same as those for the constituent elements previously described, and, further, their description will be omitted in some cases. Furthermore, a plurality of constituent elements denoted by the same reference symbols are not necessarily the same in all the functions and properties, but may be different in function and/or property as needed for the respective embodiments.

Figure 10:
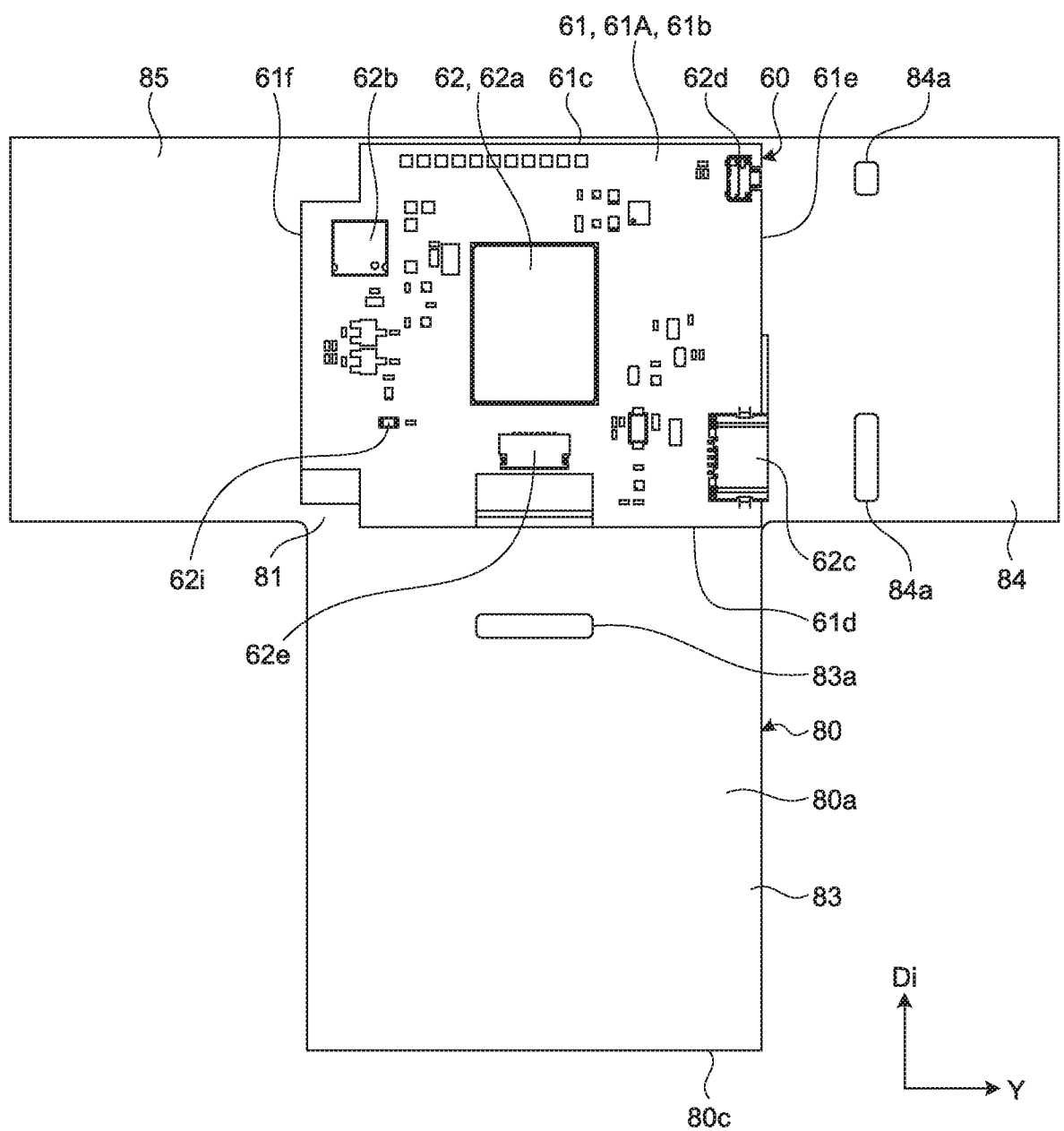
FIG. 10 is an exemplary plan view illustrating a board assembly and a sheet according to a second embodiment.

FIG. 10 is an exemplary plan view illustrating a board assembly 60 and a sheet 80 according to the second embodiment. As illustrated in FIG. 10, the sheet 80 of the second embodiment have a substantially T-shape in an unfolded state. In this case, the lower extension 83 serves to cover the upper end 61c and the lower end 61d of each of the circuit boards 61A and 61B and the front surface 61a of the circuit board 61A.

Figure 11:
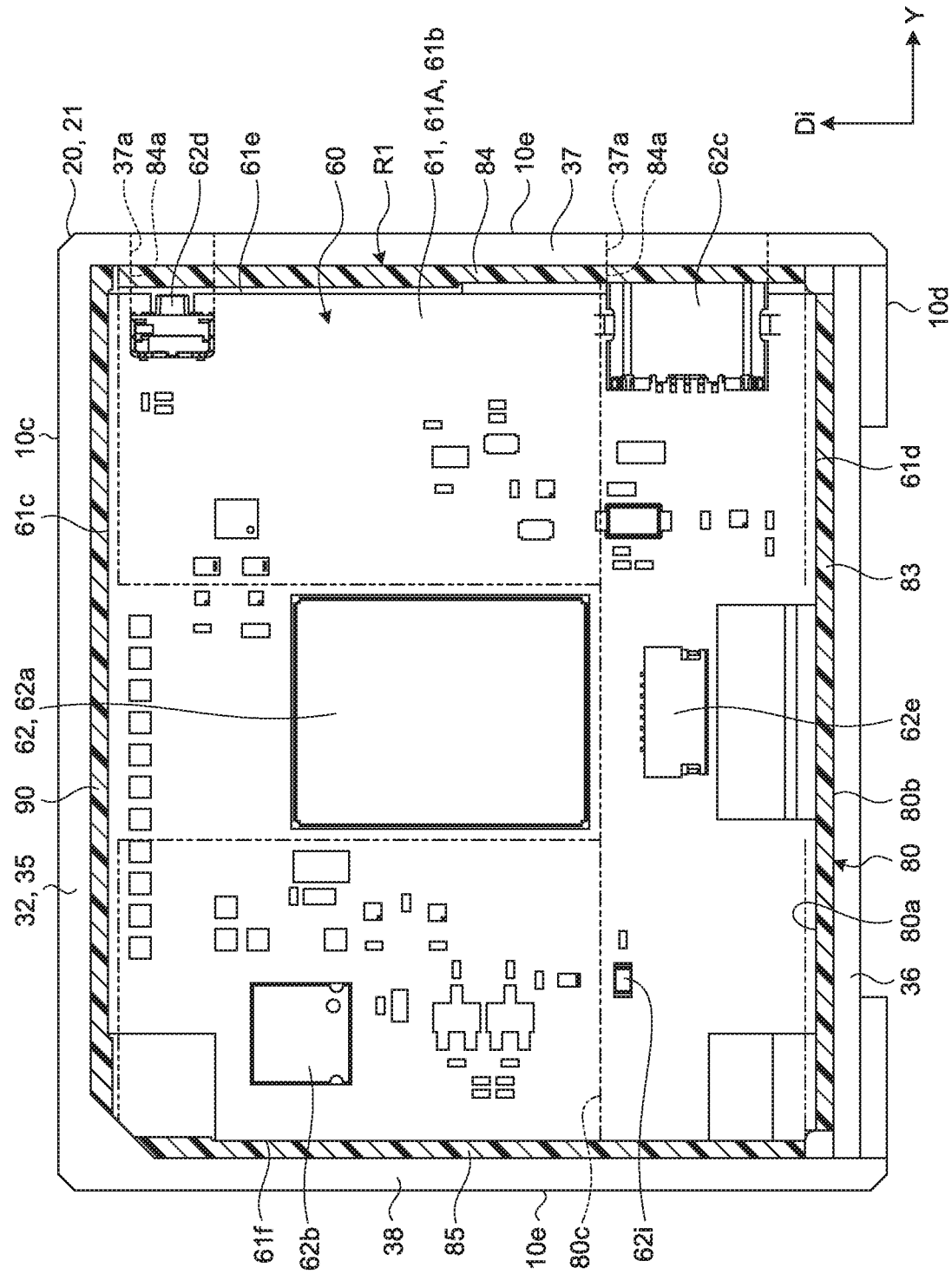
FIG. 11 is an exemplary sectional view illustrating the board assembly and the sheet accommodated in a front case, according to a modification of the second embodiment.

FIG. 11 is an exemplary sectional view illustrating the board assembly 60 and the sheet 80 accommodated in a front case 21, according to a modification of the second embodiment. As illustrated in FIG. 11, the lower extension 83 may cover the lower end 61d of each of the circuit boards 61A and 61B and part of the front surface 61a of the circuit board 61A, and another buffer material 90 may cover the upper end 61c of each of the circuit boards 61A and 61B.

The buffer material 90 is made of a gel, a synthetic resin, such as silicone or elastomer, a sponge, or another material. The buffer material 90 is interposed between the upper end 61c of each of the circuit boards 61A and 61B and the upper wall 35 of the housing 20. The upper wall 35 holds the upper end 61c of each of the circuit boards 61A and 61B through the buffer material 90.

In the second embodiment, the shape of the sheet 80 is not limited to the cross shape of the first embodiment. The sheet 80 may be substantially T-shaped as illustrated in FIG. 10, or may be substantially I-shaped, substantially L-shaped, substantially rectangular, or of another shape.

The sheet 80 has a shape different from the rectangular shape and is bent to wrap around the circuit boards 61. This serves to reduce the overlapping part of the sheet 80 and to prevent increase in the thickness of the sheet 80.

Further, another buffer material 90 may be interposed between the circuit boards 61 and the housing 20. In this case, the sheet 80 and the buffer material 90 attenuate vibration and restrain transmission of vibration between the housing 20 and the circuit boards 61.

Third Embodiment

Figure 13:
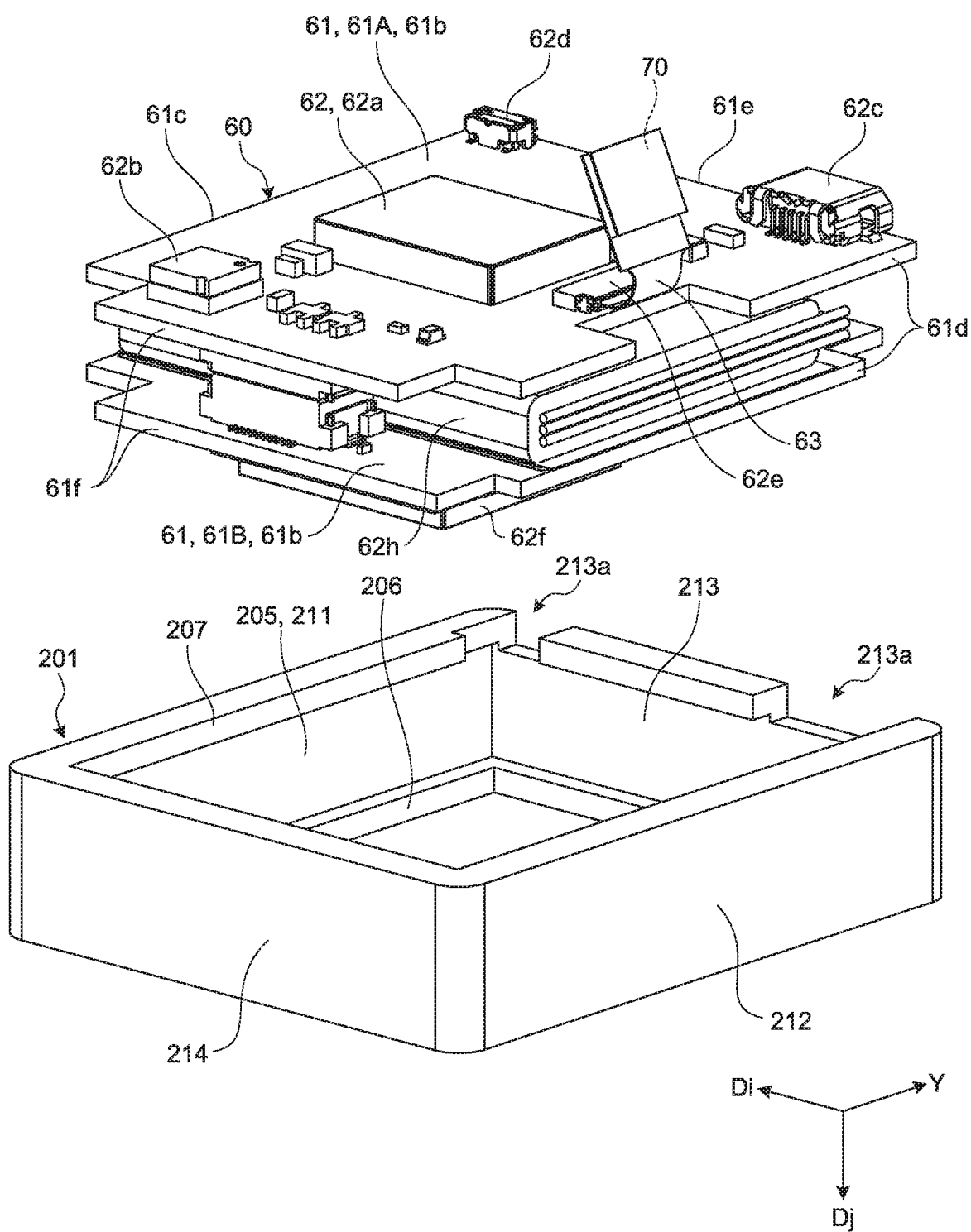
FIG. 13 is an exemplary perspective view illustrating the board assembly and the buffer member in the third embodiment, in an exploded manner.
Figure 14:
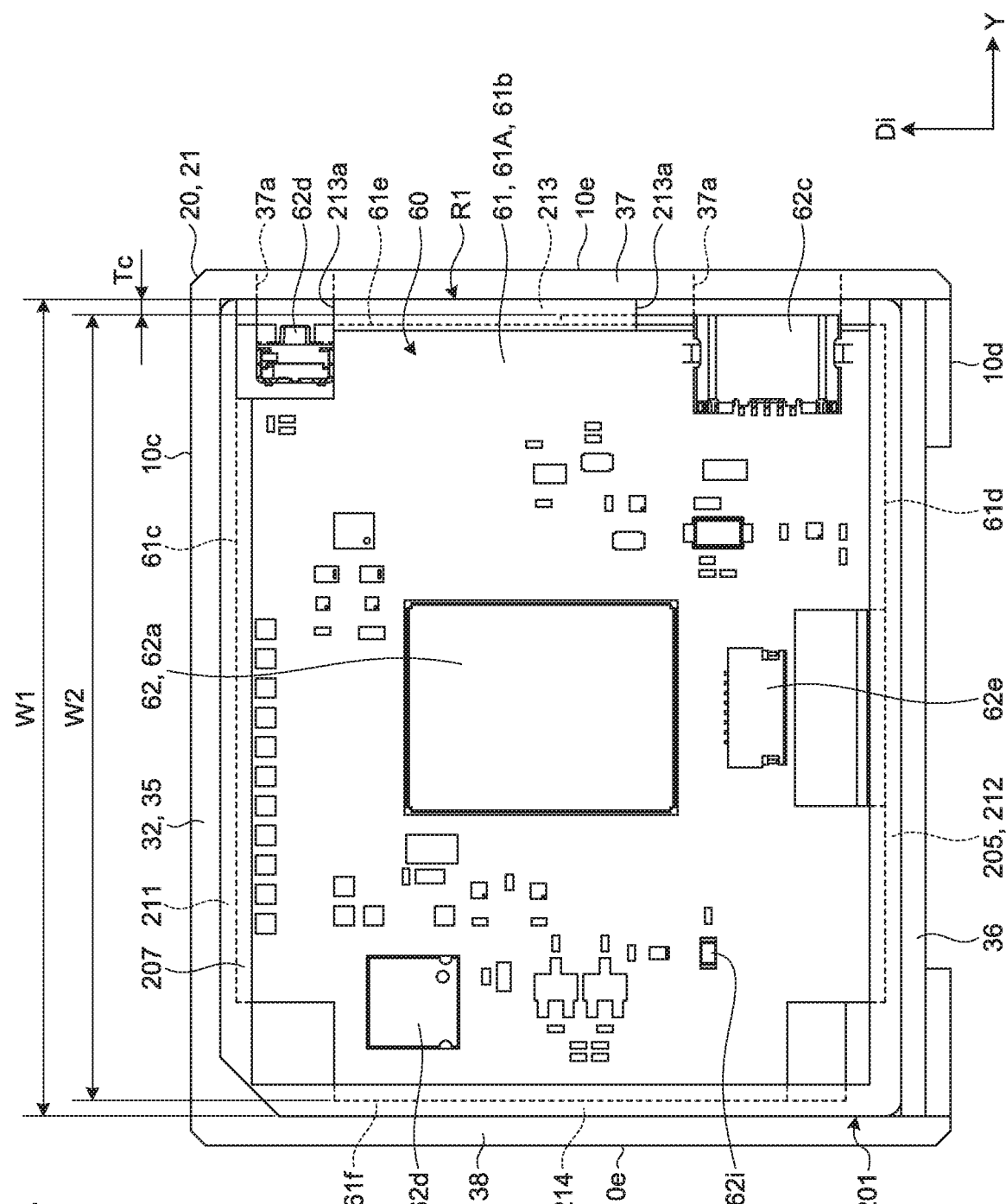
FIG. 14 is an exemplary back view illustrating the board assembly and the buffer member accommodated in the front case in the third embodiment.

Next, an explanation will be given of a third embodiment with reference to FIGS. 12 to 15. FIG. 12 is an exemplary perspective view illustrating a front case 21, a board assembly 60, and a buffer member 201, according to the third embodiment, in an exploded manner. FIG. 13 is an exemplary perspective view illustrating the board assembly 60 and the buffer member 201 in the third embodiment, in an exploded manner. FIG. 14 is an exemplary back view illustrating the board assembly 60 and the buffer member 201 accommodated in the front case 21 in the third embodiment.

In the third embodiment, the vibration detecting device 10 includes the buffer member 201 in place of the sheet 80. The buffer member 201 is an example of an elastic member. The vibration detecting device 10 may include both of the sheet 80 and the buffer member 201.

The buffer member 201 is made of, for example, translucent silicone rubber. Thus, the buffer member 201 is made of a polymer material. The buffer member 201 may be made of a gel, a synthetic resin, such as elastomer, a sponge, or another polymer material.

The silicone rubber as the material of the buffer member 201 is, for example, SH0010U or SH0020U of KCC Corporation, or TSE221-3U of Momentive Performance Materials Worldwide LLC. The material of the buffer member 201 is not limited to this example. The buffer member 201 is made of, for example, silicone rubber having a hardness of 20° or less. As the buffer member 201 is made of silicon rubber having low hardness, the buffer member 201 can easily attenuate vibration and easily restrain transmission of vibration, between the housing 20 and the circuit boards 61. The hardness of the buffer member 201 is not limited to this example.

The buffer member 201 is detachably attached to the board assembly 60 including the circuit boards 61. In other words, the buffer member 201 and the board assembly 60 mutually hold the other so as to be separable therefrom. The buffer member 201 may be simply set in contact with the board assembly 60 without being attached to the board assembly 60.

Figure 15:
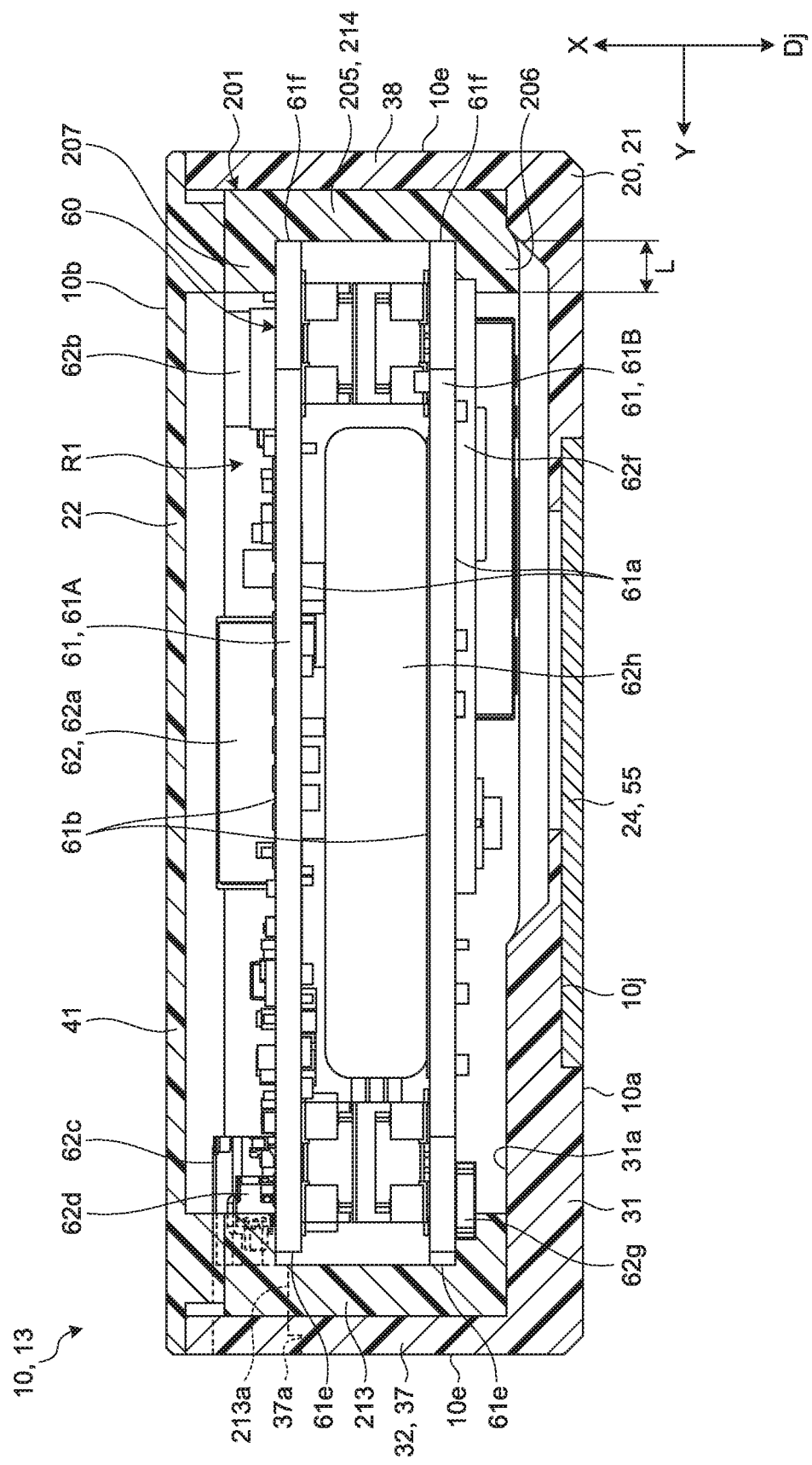
FIG. 15 is a sectional view illustrating a vibration detecting device according to the third embodiment.

FIG. 15 is a sectional view illustrating the vibration detecting device 10 according to the third embodiment. As illustrated in FIG. 15, the buffer member 201 includes a frame wall 205, a first protrusion 206, and a second protrusion 207.

As illustrated in FIG. 14, the frame wall 205 has a substantially rectangular frame shape. The frame wall 205 is not limited to this example, but may have another shape, such as a circular frame shape, in accordance with the shapes of the circuit boards 61. The frame wall 205 includes a first wall 211, a second wall 212, a third wall 213, and a fourth wall 214 in a unified manner.

The first wall 211 is located at the end of the frame wall 205 in the +Di direction, and extends in the Y direction. The second wall 212 is located at the end of the frame wall 205 in the −Di direction, and extends in the Y direction. The third wall 213 is provided between the end of the first wall 211 in the +Y direction and the end of the second wall 212 in the +Y direction, and extends in the Di direction. The fourth wall 214 is provided between the end of the first wall 211 in the −Y direction and the end of the second wall 212 in the −Y direction, and extends in the Di direction.

As illustrated in FIG. 15, the first to fourth walls 211 to 214 have a band shape having a wider width in the Dj direction. As illustrated in FIG. 14, the first wall 211 covers the upper end 61c of each of the circuit boards 61A and 61B. The second wall 212 covers the lower end 61d of each of the circuit boards 61A and 61B. The third wall 213 covers the left end 61e of each of the circuit boards 61A and 61B. The fourth wall 214 covers the right end 61f of each of the circuit boards 61A and 61B. The upper end 61c, the lower end 61d, the left end 61e, and the right end 61f of each of the circuit boards 61A and 61B may be exposed without being covered by the buffer member 201 partly.

The first wall 211 is in contact with the upper end 61c of each of the circuit boards 61A and 61B. The second wall 212 is in contact with the lower end 61d of each of the circuit boards 61A and 61B. The third wall 213 is in contact with the left end 61e of each of the circuit boards 61A and 61B. The fourth wall 214 is in contact with the right end 61f of each of the circuit boards 61A and 61B. The first to fourth walls 211 to 214 may be separated from the circuit boards 61A and 61B partly or slightly.

The circuit boards 61A and 61B of the board assembly 60 are located between the first wall 211 and the second wall 212, and are held by the first wall 211 and the second wall 212. In other words, the first wall 211 and the second wall 212 are in contact with the upper end 61c and the lower end 61d of each of the circuit boards 61A and 61B, and thereby restrict the movement of the board assembly 60 in the Di direction.

The circuit boards 61A and 61B of the board assembly 60 are located between the third wall 213 and the fourth wall 214, and are held by the third wall 213 and the fourth wall 214. In other words, the third wall 213 and the fourth wall 214 are in contact with the left end 61e and the right end 61f of each of the circuit boards 61A and 61B, and thereby restrict the movement of the board assembly 60 in the Y direction.

As illustrated in FIG. 15, the first protrusion 206 protrudes inward in the frame wall 205, from the end of the frame wall 205 in the +Dj direction. Accordingly, the first protrusion 206 has a substantially rectangular frame shape. The first protrusion 206 may protrude from at least one of the first to fourth walls 211 to 214.

The second protrusion 207 protrudes inward in the frame wall 205, from the end of the frame wall 205 in the −Dj direction. Accordingly, the second protrusion 207 has a substantially rectangular frame shape. The second protrusion 207 may protrude from at least one of the first to fourth walls 211 to 214.

The protruding length L of the first protrusion 206 from the frame wall 205 is smaller than the length of the frame wall 205 in the Dj direction. Similarly, the protruding length of the second protrusion 207 from the frame wall 205 is smaller than the length of the frame wall 205 in the Dj direction. The Dj direction is orthogonal to the front surface 61a of each circuit board 61. The length of the first protrusion 206 and the length of the second protrusion 207 are substantially equal to each other, but may be different from each other.

The first protrusion 206 and the second protrusion 207 are short, and thus can be easily and elastically deformed. Accordingly, the board assembly 60 can be easily accommodated into the inside of the frame wall 205, accompanied by deformation of the first protrusion 206 or the second protrusion 207. Thus, the buffer member 201 can be elastically attached to the board assembly 60.

The second protrusion 207 is short, and is separated from the connector 62e and the FPC 63. Consequently, the second protrusion 207 does not need a hole like the insertion hole 83a of the sheet 80. Further, the first protrusion 206 exposes the front surface 61a of the circuit board 61B and electric components 62 mounted on this front surface 61a. The second protrusion 207 exposes the rear surface 61b of the circuit board 61A and electric components 62 mounted on this rear surface 61b. The first protrusion 206 and the second protrusion 207 are not limited to this example.

The first protrusion 206 is in contact with the front surface 61a of the circuit board 61B. The first protrusion 206 may be further in contact with electric components 62 mounted on the front surface 61a of the circuit board 61B. The first protrusion 206 may be separated from the front surface 61a of the circuit board 61B partly or slightly.

The second protrusion 207 is in contact with the rear surface 61b of the circuit board 61A. The second protrusion 207 may be further in contact with electric components 62 mounted on the rear surface 61b of the circuit board 61A. The second protrusion 207 may be separated from the rear surface 61b of the circuit board 61A partly or slightly.

The circuit boards 61A and 61B of the board assembly 60 are located between the first protrusion 206 and the second protrusion 207, and are held by the first protrusion 206 and the second protrusion 207. In other words, the first protrusion 206 and the second protrusion 207 are in contact with the front surface 61a of the circuit board 61B and the rear surface 61b of the circuit board 61A, and thereby restrict the movement of the board assembly 60 in the Dj direction.

As illustrated in FIG. 13, the third wall 213 is provided with a plurality of openings 213a. Each of the openings 213a is an example of a second opening. Each opening 213a is a cutout at the end of the third wall 213 in the −Dj direction. Each opening 213a may be a hole. The external connector 62c and the external operation switch 62d are exposed outside the housing 20 through the openings 213a of the buffer member 201 and the first holes 37a of the housing 20.

As illustrated in FIGS. 14 and 15, the buffer member 201 is attached to the board assembly 60, and is accommodated in the housing 20. The buffer member 201 is in contact with the housing 20 and the circuit boards 61, so as to be separable (detachable) therefrom.

The buffer member 201 is interposed between the housing 20 and each of the rear surface 61b of the circuit board 61A, the front surface 61a of the circuit board 61B, and the upper end 61c, the lower end 61d, the left end 61e, and the right end 61f of each of the circuit boards 61A and 61B. Consequently, the circuit boards 61 are held by the housing 20 through the buffer member 201 at positions separated from the housing 20.

As illustrated in FIG. 14, the frame wall 205 is interposed between the housing 20 and each of the upper end 61c, the lower end 61d, the left end 61e, and the right end 61f of each of the circuit boards 61A and 61B. The frame wall 205 surrounds the circuit boards 61A and 61B, and is surrounded by the peripheral wall 32 of the front case 21.

The first wall 211 is interposed between the upper end 61c of each of the circuit boards 61A and 61B and the upper wall 35 of the front case 21. The second wall 212 is interposed between the lower end 61d of each of the circuit boards 61A and 61B and the lower wall 36 of the front case 21. Consequently, the front case 21 holds the circuit boards 61 in the Di direction such that vibration in the Di direction can be attenuated by the buffer member 201.

The third wall 213 is interposed between the left end 61e of each of the circuit boards 61A and 61B and the left wall 37 of the front case 21. The fourth wall 214 is interposed between the right end 61f of each of the circuit boards 61A and 61B and the right wall 38 of the front case 21. Consequently, the front case 21 holds the circuit boards 61 in the Y direction such that vibration in the Y direction can be attenuated by the buffer member 201.

As illustrated in FIG. 15, the first protrusion 206 is interposed between the front surface 61a of the circuit board 61B and the front wall 31 of the front case 21. The second protrusion 207 is interposed between the rear surface 61b of the circuit board 61A and the rear wall 41 of the back cover 22. Consequently, the housing 20 holds the circuit boards 61 in the Dj direction such that vibration in the Dj direction can be attenuated by the buffer member 201.

At least some of the electric components 62 mounted on the front surface 61a of the circuit board 61B and the rear surface 61b of the circuit board 61A are exposed without being covered by the buffer member 201. However, the buffer member 201 holds the board assembly 60 at a position such that the electric components 62 are separated from the housing 20. Thus, vibration of the housing 20 can be hardly transmitted to the vibration sensor 70 through the electric components 62, the circuit boards 61, and the FPC 63.

Next, an exemplary explanation will be given of part of an assembling method of the vibration detecting device 10. The assembling method of the vibration detecting device 10 is not limited to the following method, but may be performed by using another method. First, as illustrated in FIG. 13, the board assembly 60 is assembled. The FPC 63 may be assembled to the board assembly 60 later.

Then, the board assembly 60 is accommodated into the inside of the frame wall 205, accompanied by deformation of the first protrusion 206 or the second protrusion 207. Consequently, the buffer member 201 is attached to the board assembly 60.

Then, as illustrated in FIG. 14, the circuit boards 61 and the buffer member 201 are press-fitted into the first compartment R1 of the front case 21. Consequently, the buffer member 201 is interposed between the housing 20 and each of the front surface 61a of the circuit board 61B and the upper end 61c, the lower end 61d, the left end 61e, and the right end 61f of each of the circuit boards 61A and 61B.

The material of the buffer member 201 has hardness such that the buffer member 201 can be easily attached to the board assembly 60, and the buffer member 201 and the substrate assembly 60 can be easily accommodated in the front case 21. For example, the buffer member 201 has hardness such that the buffer member 201 can be hardly peeled off from the board assembly 60 due to its own weight and/or can be hardly peeled off from the board assembly 60 when being press-fitted into the housing 20.

Then, the bottom frame 23 is attached to the front case 21. Further, the FPC 63 and the vibration sensor 70 are attached to the bottom frame 23.

Then, as illustrated in FIG. 15, the back cover 22 is attached to the front case 21. The back cover 22 is fixed to the front case 21 while pressing the second protrusion 207 against the rear surface 61b of the circuit board 61A.

In the natural uncompressed state, the thickness of the buffer member 201 is larger than a half of the difference between the width W1 of the first compartment R1 and the width W2 of each circuit board 61, which are illustrated in FIG. 14. Consequently, when the board assembly 60 and the buffer member 201 are accommodated in the first compartment R1, the buffer member 201 is compressed between the circuit boards 61 and the housing 20. Specifically, the buffer member 201 is interposed between the circuit boards 61 and the housing 20, in a compressed state. The buffer member 201 may have a non-compressible part.

The thickness Tc of the compressed buffer member 201 is, for example, about 50 to 80% of the thickness of the buffer member 201 in the natural state. The thickness Tc is not limited to this example, but is set for the buffer member 201 to have desired vibration absorbing performance.

The dimensional difference described above is not limited by the width W1 between the left wall 37 and the right wall 38 and the width W2 between the left end 61e and the right end 61f of each circuit board 61. The buffer member 201 is compressed between the rear surface 61b of the circuit board 61A and the back cover 22, between the front surface 61a of the circuit board 61B and the front wall 31, and between the peripheral wall 32 and the upper end 61c, the lower end 61d, the left end 61e, and the right end 61f of each of the circuit boards 61A and 61B.

As the buffer member 201 is elastic, the buffer member 201 can be deformed in accordance with the shape of the gap between each circuit board 61 and the housing 20. Consequently, the buffer member 201 can come into contact with each circuit board 61, each electric component 62, and the housing 20, while enlarging the contact area.

In the housing 20 the circuit boards 61 are held by the housing 20 through the buffer member 201 attached to these circuit boards 61. Specifically, the front wall 31 supports the front surface 61a of the circuit board 61B through the first protrusion 206, the peripheral wall 32 supports the upper end 61c, the lower end 61d, the left end 61e, and the right end 61f of each of the circuit boards 61A and 61B through the frame wall 205, and the rear wall 41 supports the rear surface 61b of the circuit board 61A through the second protrusion 207. Consequently, the movement of each circuit board 61 is restricted.

The buffer member 201 is in direct contact with the housing 20, each circuit board 61, and each electric component 62, without an adhesive or double-sided adhesive tape interposed therebetween. Thus, the buffer member 201 is in contact with the housing 20, each circuit board 61, and each electric component 62, so as to be separable (detachable) therefrom.

As described above, each circuit board 61 is not fixed to the housing 20 with screws, pins, a double-sided tape, adhesive, filler, or the like, but is held by the housing 20 through the buffer member 201 with spacing from the housing 20. Thus, each circuit board 61 can move relative to the housing 20 by elastic deformation of the buffer member 201.

The buffer member 201 attenuates vibration and restrains transmission of vibration, between the circuit boards 61 and the housing 20. Thus, vibration of the housing 20 can be hardly transmitted to the vibration sensor 70 through the circuit boards 61 and the FPC 63. Further, the circuit boards 61 are restrained from being vibrated due to resonance.

Then, the shield 24 is attached to the front case 21 and the bottom frame 23, and the attachment 11 is attached to the bottom frame 23. As a result, the vibration detecting device 10 is assembled.

The board assembly 60 may be taken out of the housing 20 after the vibration detecting device 10 is produced. In this case, the back cover 22 is detached from the front case 21, and the board assembly 60 is detached from the buffer member 201, accompanied by deformation of the first protrusion 206 or the second protrusion 207. Accordingly, in the vibration detecting device 10, the board assembly 60 can be detached from the housing 20, without an operation of removing the adhesive or filler.

In the vibration detecting device 10 according to the third embodiment described above, the circuit boards 61 are held by the housing 20 through the buffer member 201. That is, the buffer member 201 spreads between the housing 20 and the circuit boards 61 to be able to restrain transmission of vibration between the housing 20 and the circuit boards 61, and attenuate vibration of the circuit boards 61. Thus, the buffer member 201 serves to restrain vibration noise due to vibration of the housing 20 transmitted through the circuit boards 61 and/or resonance of the circuit boards 61 from entering the vibration sensor 70. Further, the buffer member 201 is detachable from the housing 20, so that the circuit boards 61 can be more easily detached from the housing 20 than a vibration absorbing material filled in-between the circuit boards 61 and the housing 20, for example. In addition, the circuit boards 61 can be equipped with a member with a hole, such as the external connector 62c, and/or a movable member, such as the external operation switch 62d.

The buffer member 201 is detachably attached to the circuit boards 61. Consequently, the circuit boards 61 and the attached buffer member 201 can be handled as one subassembly. The circuit boards 61 with the attached buffer member 201 can be accommodated in the housing 20. This facilitates the assembly of the vibration detecting device 10.

The buffer member 201 is interposed between the housing 20 and each of the front surfaces 61a, the rear surfaces 61b, the left ends 61e, and the right ends 61f. This can restrict the circuit boards 61 from coming into contact with the housing 20, and vibration noise due to vibration of the housing 20 transmitted through the circuit boards 61 and/or resonance of the circuit boards 61 from entering the vibration sensor 70.

The buffer member 201 includes, in a unified manner, the frame wall 205 that covers the upper ends 61c, the lower ends 61d, the left ends 61e, and the right ends 61f. The frame wall 205 stands between the housing 20, and the upper ends 61c, the lower ends 61d, the left ends 61e, and the right ends 61f. Because of this, the buffer member 201 can cover the ends of the circuit boards 61 from substantially all the directions, preventing the circuit boards 61 from coming into contact with the housing 20. This can avoid vibration noise due to vibration of the housing 20 transmitted through the circuit boards 61 and/or resonance of the circuit boards 61 from entering the vibration sensor 70. Further, since the buffer member 201 is integrated with the frame wall 205, the buffer member 201 can be easily handled during the assembly of the vibration detecting device 10.

The buffer member 201 includes the first protrusion 206 and the second protrusion 207 that protrude from the frame wall 205. The length L of the first protrusion 206 from the frame wall 205 is smaller than the length of the frame wall 205 in the Dj direction orthogonal to the front surface 61a. That is, the first protrusion 206 of a relatively short length is elastically deformable easily. Thus, the circuit boards 61 can be easily inserted into the inside of the frame wall 205 by the elastic deformation of the first protrusion 206.

The buffer member 201 contains silicone rubber. Thus, it is possible to produce, at a lower cost, the buffer member 201 serving to reduce transmission of vibration between the housing 20 and the circuit boards 61, and attenuate vibration of the circuit boards 61. Further, owing to the silicone rubber with no viscosity or less viscosity than gel, the buffer member 201 can be easily detached from the circuit boards 61. Further, the silicon rubber is higher in strength than gel, therefore, it is less likely to be damaged. Thus, the buffer member 201 is reusable.

The buffer member 201 for holding the circuit boards 61 is higher in rigidity than the sheet 80. That is, the buffer member 201 is less likely to vary in shape, and easily attachable to the circuit boards 61. Thus, the buffer member 201 can be downsized, reducing the manufacturing cost.

The buffer member 201 spreads between the circuit boards 61 and the housing 20 in a compressed state. Specifically, the distance between the circuit boards 61 and the housing 20 is smaller than the thickness of the buffer member 201 in the natural state. Thereby, the restoring force of the buffer member 201 works to hold the circuit boards 61, and restrict the circuit boards 61 from vibrating.

The housing 20 is provided with the first holes 37a, and the buffer member 201 is provided with the openings 213a. The external connector 62c is mounted on the circuit boards 61, and is exposed outside the housing 20 through one of the first holes 37a and one of the openings 213a. Consequently, the external connector 62c is usable from outside the housing 20. For example, the external connector 62c is operable or viewable from outside, and/or another component is insertable into the external connector 62.

Fourth Embodiment

Figure 16:
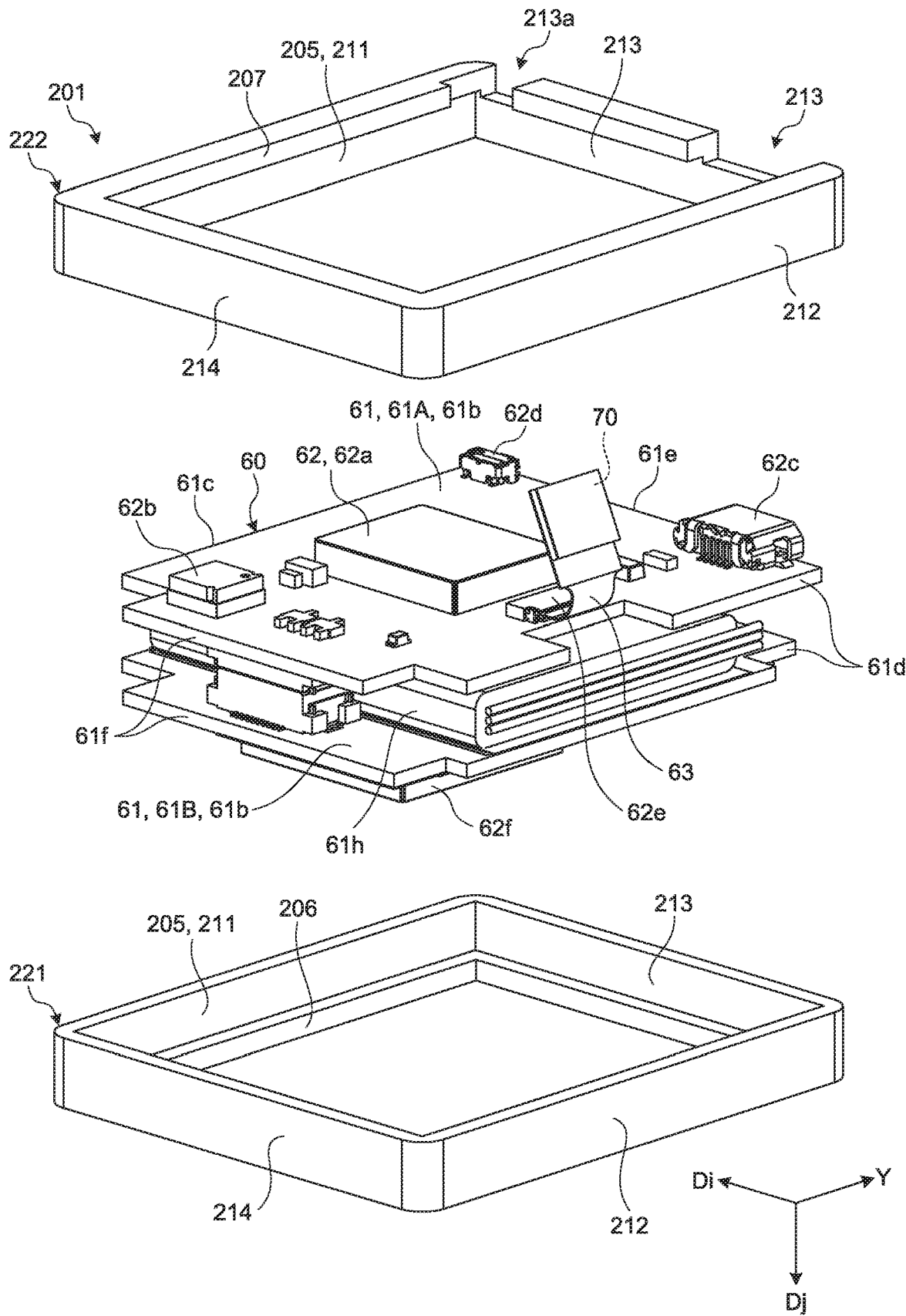
FIG. 16 is an exemplary perspective view illustrating a board assembly and a buffer member according to a fourth embodiment, in an exploded manner.

Next, an explanation will be given of a fourth embodiment with reference to FIG. 16. FIG. 16 is an exemplary perspective view illustrating a board assembly 60 and a buffer member 201 according to the fourth embodiment, in an exploded manner. As illustrated in FIG. 16, the fourth embodiment differs from the third embodiment in that the buffer member 201 includes a plurality of members.

The buffer member 201 includes a front member 221 and a rear member 222. The front member 221 includes a frame wall 205 and a first protrusion 206. The rear member 222 includes a frame wall 205 and a second protrusion 207. In other words, each of the front member 221 and the rear member 222 includes a first wall 211, a second wall 212, a third wall 213, and a fourth wall 214.

The front member 221 and the rear member 222 are set in contact with each other, and thereby form the buffer member 201. For example, the front member 221 and the rear member 222 are fitted to each other. The front member 221 and the rear member 222 may be separated from each other.

As described in the fourth embodiment, the buffer member 201 may include a plurality of members. In FIG. 16, the buffer member 201 includes the two members separable in the Dj direction, but the buffer member 201 is not limited to this example. For example, the buffer member 201 may include two members separable in the Y direction or Di direction, or may include three or more members.

According to at least one of the first to fourth embodiments, the circuit board is held by the housing through an elastic member. Thus, the elastic member is interposed between the housing and the circuit board, and can restrain transmission of vibration between the housing and the circuit board and attenuate vibration of the circuit board. It is thus possible to prevent vibration noise due to vibration of the housing transmitted through the circuit board and/or resonance of the circuit board from entering the vibration sensor. Further, the elastic member is detachable from the housing, so that the circuit board can be more easily detached from the housing than a vibration absorbing material filled in-between the circuit board and the housing, for example. In addition, the circuit board can be equipped with a member with a hole, such as a connector, and/or a movable member, such as a switch.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vibration detecting device comprising:
   a housing;
   a vibration sensor accommodated in the housing;
   a circuit board accommodated in the housing and equipped with a first electric component, the first electric component configured to process a detection signal of the vibration sensor;
   a flexible wiring member that electrically connects the vibration sensor and the circuit board to each other; and
   an elastic member containing a polymer material, and accommodated in the housing in contact with the housing and the circuit board, and being detachable from the housing,
   wherein the circuit board is held by the housing through the elastic member,
   the circuit board includes:
     a first surface,
     a second surface opposite to the first surface,
     a first end in a first direction along the first surface, and
     a second end in a second direction opposite to the first direction,
   the elastic member is interposed between the housing and each of the first surface, the second surface, the first end, and the second end,
   the circuit board includes:
     a third end in a third direction orthogonal to the first direction along the first surface, and
     a fourth end in a fourth direction opposite to the third direction,
   the elastic member includes a frame wall in a unified manner, the frame wall that covers the first end, the second end, the third end, and the fourth end, and
   the frame wall is interposed between the housing and each of the first end, the second end, the third end, and the fourth end.

2. The vibration detecting device according to claim 1, wherein
   the elastic member is detachably attached to the circuit board.

3. The vibration detecting device according to claim 1, wherein
the elastic member includes:
a first protrusion that protrudes from the frame wall and is interposed between the first surface and the housing, and
a second protrusion that protrudes from the frame wall and is interposed between the second surface and the housing, and
the first protrusion from the frame wall is smaller in length than the frame wall in a direction orthogonal to the first surface.

4. The vibration detecting device according to claim 3, wherein
the circuit board includes a first board and a second board electrically connected to the first board,
the first board includes the first surface, a third surface opposite to the first surface, the first end, the second end, the third end, and the fourth end, and
the second board includes the second surface and a fourth surface facing the third surface.

5. The vibration detecting device according to claim 4, wherein
the second board includes:
a fifth end in the first direction,
a sixth end in the second direction,
a seventh end in the third direction, and
an eighth end in the fourth direction,
the second board is separated from the first board, and
the frame wall is interposed between the housing and each of the fifth end, the sixth end, the seventh end, and the eighth end, and covers a space between the first board and the second board.

6. The vibration detecting device according to claim 5, wherein
the elastic member comprises a first member including the first protrusion, and a second member including the second protrusion, and
the frame wall includes a first frame wall of the first member, and a second frame wall of the second member.

7. The vibration detecting device according to claim 3, further comprising
a connector that is mounted on the first surface with spacing from the frame wall and the first protrusion, and is exposed outside the elastic member,
wherein the wiring member is electrically connected to the circuit board through the connector.

8. The vibration detecting device according to claim 1, wherein the elastic member contains silicone rubber.

9. A vibration detecting device comprising:
a housing;
a vibration sensor accommodated in the housing;
a circuit board accommodated in the housing and equipped with a first electric component, the first electric component configured to process a detection signal of the vibration sensor;
a flexible wiring member that electrically connects the vibration sensor and the circuit board to each other; and
an elastic member containing a polymer material, and accommodated in the housing in contact with the housing and the circuit board, and being detachable from the housing, wherein
the circuit board is held by the housing through the elastic member,
the elastic member comprises a flexible sheet,
the circuit board is held by the housing through the sheet,
the housing comprises a box member and a lid member,
the box member includes an inner surface facing the circuit board, and a peripheral wall that protrudes from the inner surface and surrounds the circuit board,
the lid member is attached to an end of the peripheral wall such that the lid member closes an inside of the box member and presses part of the sheet against the circuit board,
the sheet includes a surface facing the circuit board, and an edge in a direction along the surface, and
the edge is located between the circuit board and the lid member.

10. The vibration detecting device according to claim 9, wherein the sheet is formed of a gel.

11. The vibration detecting device according to claim 10, wherein the sheet is formed of αGEL (registered trademark).

12. The vibration detecting device according to claim 9, wherein
the circuit board includes a first surface, a second surface opposite to the first surface, a first end in a first direction along the first surface, and a second end in a second direction opposite to the first direction, and
the sheet is bent to wrap around the circuit board, and is interposed between the housing and each of the first surface, the second surface, the first end, and the second end.

13. The vibration detecting device according to claim 9, wherein
the sheet includes mutually directly contacting, overlapping portions, and is in direct contact with the housing and the circuit board.

14. The vibration detecting device according to claim 1, wherein
the elastic member is interposed between the circuit board and the housing in a compressed state.

15. A vibration detecting device comprising:
a housing;
a vibration sensor accommodated in the housing;
a circuit board accommodated in the housing and equipped with a first electric component, the first electric component configured to process a detection signal of the vibration sensor;
a flexible wiring member that electrically connects the vibration sensor and the circuit board to each other; and
an elastic member containing a polymer material, and accommodated in the housing in contact with the housing and the circuit board, and being detachable from the housing, wherein
the circuit board is held by the housing through the elastic member,
the housing is provided with a first opening,
the elastic member is provided with a second opening, and
the circuit board is equipped with a second electric component that is exposed outside the housing through the first opening and the second opening.

16. A vibration detecting device comprising:
a housing;
a vibration sensor accommodated in the housing;
a circuit board accommodated in the housing and equipped with a first electric component, the first electric component configured to process a detection signal of the vibration sensor;
a flexible wiring member that electrically connects the vibration sensor and the circuit board to each other; and an elastic member containing a polymer material, and accommodated in the housing in contact with the housing and the circuit board, and being detachable from the housing, wherein the circuit board is held by the housing through the elastic member, the housing is provided with a hole, the circuit board has a light emitting component mounted thereon, and the elastic member covers the light emitting component, and allows light to pass through.

* * * * *